(12) United States Patent
Kubota et al.

(10) Patent No.: US 9,935,296 B2
(45) Date of Patent: Apr. 3, 2018

(54) DISPLAY DEVICE AND ELECTRONIC APPARATUS WITH ANTIREFLECTION FUNCTION

(71) Applicant: SONY CORPORATION, Tokyo (JP)

(72) Inventors: Eigo Kubota, Tokyo (JP); Jianglin Yue, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/910,663

(22) PCT Filed: Jun. 13, 2014

(86) PCT No.: PCT/JP2014/003150
§ 371 (c)(1),
(2) Date: Feb. 5, 2016

(87) PCT Pub. No.: WO2015/019532
PCT Pub. Date: Feb. 12, 2015

(65) Prior Publication Data
US 2016/0197310 A1   Jul. 7, 2016

(30) Foreign Application Priority Data

Aug. 9, 2013  (JP) ................................. 2013-167001

(51) Int. Cl.
| | | |
|---|---|---|
| *H01L 51/52* | (2006.01) | |
| *H01L 27/32* | (2006.01) | |
| *H01L 25/04* | (2014.01) | |
| *H01L 33/54* | (2010.01) | |
| *H01L 33/58* | (2010.01) | |
| *H05B 33/04* | (2006.01) | |
| *H05B 33/12* | (2006.01) | |
| *H01L 25/075* | (2006.01) | |
| *H01L 33/44* | (2010.01) | |

(52) U.S. Cl.
CPC ........ *H01L 51/5281* (2013.01); *H01L 25/048* (2013.01); *H01L 27/3246* (2013.01); *H01L 33/54* (2013.01); *H01L 33/58* (2013.01); *H01L 51/5237* (2013.01); *H01L 51/5268* (2013.01); *H01L 51/5284* (2013.01); *H05B 33/04* (2013.01); *H05B 33/12* (2013.01); *H01L 25/0753* (2013.01); *H01L 33/44* (2013.01); *H01L 2924/0002* (2013.01); *H01L 2933/0091* (2013.01)

(58) Field of Classification Search
CPC ............. H01L 51/5281; H01L 51/5284; H01L 51/5268
USPC .......................................... 313/512
See application file for complete search history.

(56) References Cited

U.S. PATENT DOCUMENTS

| | | | | |
|---|---|---|---|---|
| 6,433,487 B1 * | 8/2002 | Yamazaki | ........... | H01L 27/3281 136/261 |
| 2003/0086046 A1 * | 5/2003 | You | ................... | G02F 1/133555 349/149 |

(Continued)

*Primary Examiner* — Christopher Raabe
(74) *Attorney, Agent, or Firm* — Chip Law Group

(57) ABSTRACT

A display device includes: light emitting units; a light absorbing unit that surrounds each of the light emitting units; and a low-reflection layer provided on the surfaces of the light emitting units and the surface of the light absorbing unit. The surface of the light absorbing unit is a corrugated surface that diffuses light, and the low-reflection layer is formed along the corrugated surface.

16 Claims, 17 Drawing Sheets

(56) References Cited

U.S. PATENT DOCUMENTS

| | | | |
|---|---|---|---|
| 2005/0263757 A1* | 12/2005 | Lee | H01L 27/3211 257/40 |
| 2010/0044692 A1* | 2/2010 | Kim | H01L 51/5281 257/40 |
| 2010/0052518 A1* | 3/2010 | Jeon | H01L 51/5203 313/504 |
| 2010/0052519 A1* | 3/2010 | Jeon | H01L 27/3246 313/504 |
| 2010/0052520 A1* | 3/2010 | Jeon | H01L 51/5281 313/504 |
| 2010/0171106 A1* | 7/2010 | Jung | H01L 27/3246 257/40 |
| 2011/0234087 A1* | 9/2011 | Takahashi | G09G 3/3233 313/498 |
| 2012/0235175 A1* | 9/2012 | Prushinskiy | H01L 27/3241 257/88 |
| 2015/0228700 A1* | 8/2015 | Cho | H01L 27/3244 257/40 |
| 2016/0020358 A1* | 1/2016 | Lee | H01L 33/24 257/13 |

* cited by examiner

A

B

L1: ONLY WITH GLASS
L2: WITH LOW-REFLECTION COATING (MEASURED)
L3: WITH LOW-REFLECTION COATING (THEORETICAL)

A — SOURCE LIGHT DISTRIBUTION SHAPES (PRIOR TO DIFFUSION)

B — LIGHT DISTRIBUTION SHAPES AFTER DIFFUSION

DISPLAY DEVICE AND ELECTRONIC APPARATUS WITH ANTIREFLECTION FUNCTION

TECHNICAL FIELD

The present technology relates to a display device and an electronic apparatus. Particularly, the present technology relates to a display device and an electronic apparatus that have an antireflection function.

BACKGROUND ART

The outermost surface of a conventional display device is normally a flat surface formed with a single component material of a glass layer or a transparent resin layer. In recent years, however, there has been suggested display devices each having an outermost surface that is a corrugated surface (an uneven surface) formed with constituent materials. For example, In Patent Documents 1 and 2, the outermost surface of each display device is formed by repeatedly arranging Light Emitting Diode (LED) sealing portions and unit structures formed with black-colored portions surrounding the LED sealing portions. Therefore, the LED sealing portions are not located at the same height as the surfaces of the black-colored portions, and the surface of the display device is a corrugated surface having recesses. Also, each of the LED sealing portions or the black-colored portions may not have a flat surface, and may have a corrugated surface.

At the boundary between the outermost surface of a display device and the air, external light reflection at the reflectance corresponding to the refractive index difference between the outermost surface and the air (Fresnel reflection) occurs, and as a result, photopic contrast becomes lower. Therefore, for display devices having outermost surfaces formed with corrugated surfaces as described above, there is a demand for a technology of reducing external light reflection and improving photopic contrast.

CITATION LIST

Patent Documents

Patent Document 1: Japanese Patent Application Laid-Open No. 2003-173149
Patent Document 2: Japanese Patent Application Laid-Open No. 2009-076949

SUMMARY OF THE INVENTION

Problems to be Solved by the Invention

Therefore, the present technology aims to provide a display device and an electronic apparatus that can improve contrast.

Solutions to Problems

So as to solve the above problems, a first technology lies in a display device that includes:
light emitting units;
a light absorbing unit that surrounds each of the light emitting units; and
a low-reflection layer provided on the surfaces of the light emitting units and the surface of the light absorbing unit, wherein
the surface of the light absorbing unit is a corrugated surface that diffuses light, and
the low-reflection layer is formed along the corrugated surface.

A second technology lies in a display device that includes display cells that are two-dimensionally arranged, each of the display cells including:
light emitting units;
a light absorbing unit that surrounds each of the light emitting units; and
a low-reflection layer provided on the surfaces of the light emitting units and the surface of the light absorbing unit, wherein
the surface of the light absorbing unit is a corrugated surface that diffuses light, and
the low-reflection layer is formed along the corrugated surface.

A third technology lies in an electronic apparatus that includes
a display device including:
light emitting units;
a light absorbing unit that surrounds each of the light emitting units; and
a low-reflection layer provided on the surfaces of the light emitting units and the surface of the light absorbing unit, wherein
the surface of the light absorbing unit is a corrugated surface that diffuses light, and
the low-reflection layer is formed along the corrugated surface.

Effects of the Invention

As described above, according to the present technology, contrast of a display device can be improved.

MODES FOR CARRYING OUT THE INVENTION

The following is a description of embodiments of the present technology, with reference to the drawings. Explanation will be made in the order shown below.

1. First Embodiment (a first example of a display device)
1.1 Structure of a display device
1.2 Structure of a large-screen display device
1.3 Functions of a display device
1.4 Method of manufacturing a display device
2. Second embodiment (a second example of a display device)
2.1 Structure of a display device
2.2 Method of manufacturing a display device
3. Third Embodiment (a third example of a display device)
3.1 Outline
3.2 Structure of a display device
3.3 Method of forming a light diffusion layer
3.4 Effects
3.5 Modifications
4. Fourth embodiment (examples of electronic apparatuses)

1. First Embodiment 1.1 Structure of a Display Device

Figure 1:
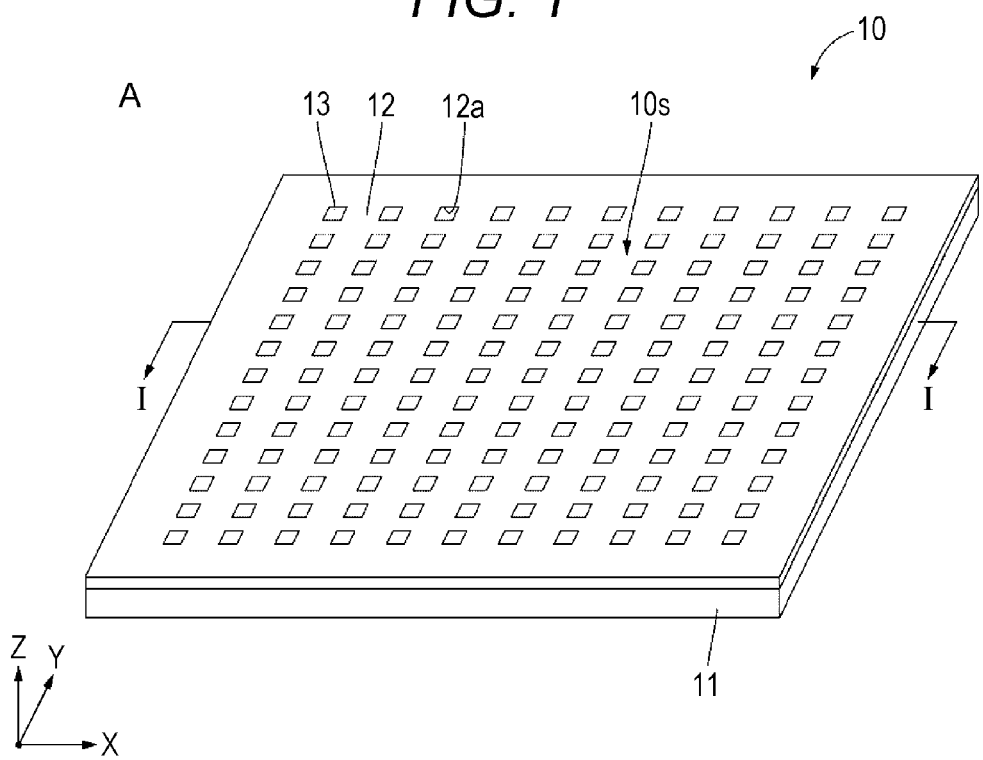
FIG. 1A is a perspective view of an example of the exterior of a display device according to a first embodiment of the present technology.
FIG. 1B is a cross-sectional view of the display device, taken along the I-I line in FIG. 1A.
Figure 1:
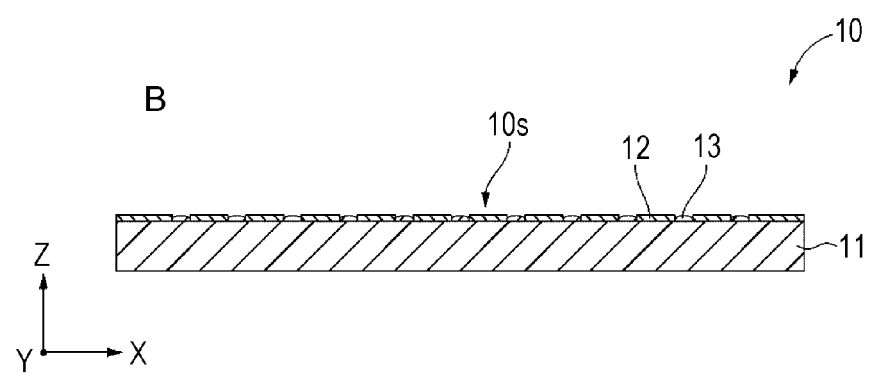

As shown in FIGS. 1A and 1B, a display device 10 according to a first embodiment of the present technology includes a circuit board 11, a light absorbing unit 12 provided on the surface of the circuit board 11, and light emitting units 13. The display device 10 is a so-called Light Emitting Diode (LED) display device, and has a rectangular display surface 10s on which a user visually recognizes a displayed image. In this specification, two directions perpendicular to each other in the in-plane direction of the display surface 10s are referred to as the "x-axis direction" and the "y-axis direction", and a direction perpendicular to the display surface 10s (or the thickness direction of the display device 10) is referred to as the "z-axis direction". Of the two principal surfaces of the display device 10 or a component forming the display device 10, the principal surface on the side on which a user visually recognizes a displayed image is referred to as the "front surface", and the principal surface on the opposite side is referred to as the "back surface".

The display surface 10s is formed with the surfaces of the light absorbing unit 12 and the light emitting units 13. The light absorbing unit 12 and the light emitting units 13 form steps in the z-axis direction, and therefore, the display surface 10s has a corrugated surface.

(Light Absorbing Unit)

The light absorbing unit (light absorbing layer) 12 is a black layer having openings 12a (a so-called black matrix). The openings 12a are two-dimensionally arranged in the x-axis direction and the y-axis direction at regular intervals on the surface of the circuit board 11. Through these openings 12a, the surfaces of the light emitting units 13 are exposed. The shape of the openings 12a may be a polygonal shape such as a rectangular shape or a rhombic shape, or a circular shape, for example. However, the shape of the openings 12a is not limited to those shapes. In the example shown in FIG. 1A, the openings 12a each have a rectangular shape.

Figure 2:
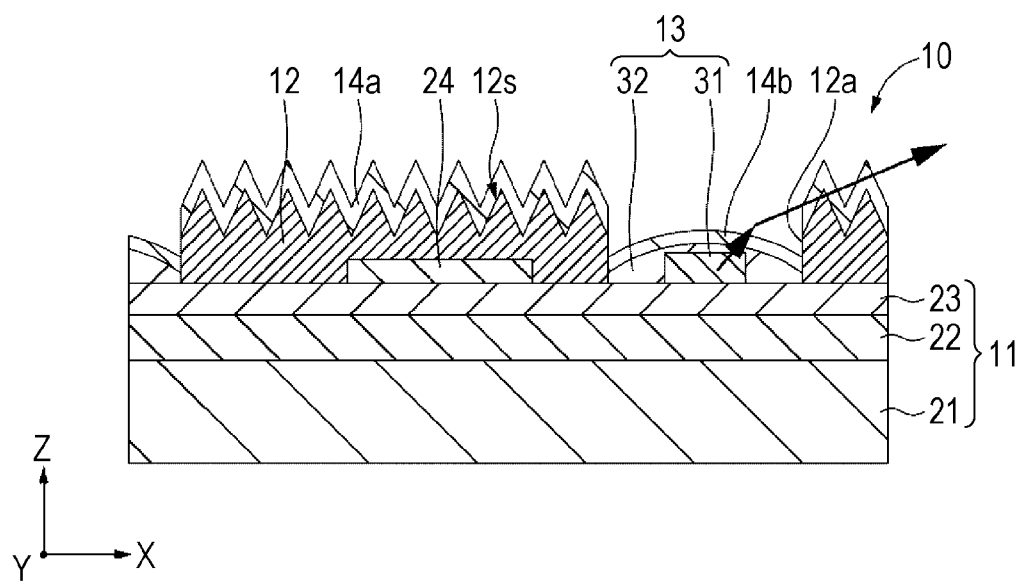
FIG. 2 is an enlarged cross-sectional view of part of FIG. 1B.

As shown in FIG. 2, a finely corrugated surface 12s that diffuses light is provided on the surface of the light absorbing unit 12. This finely corrugated surface 12s is formed by causing the surfaces of fine particles to protrude from the surface of the light absorbing unit 12, or by transferring a finely corrugated shape onto the surface of the light absorbing unit 12. These two formation methods may be combined.

The mean particle size of the fine particles is in the range of 4 μm to 20 μm, for example. As the fine particles, inorganic fine particles and/or organic fine particles can be used. The organic fine particles that can be used here may contain urethane, acrylic resin (PMMA), polystyrene (PS), an acrylic-styrene copolymer, melamine, or polycarbonate (PC), for example. The inorganic fine particles that can be used here may contain silicon oxide, titanium oxide, aluminum oxide, zinc oxide, tin oxide, calcium carbonate, barium sulfate, talc, kaolin, or calcium sulfate, for example.

(Light Emitting Units)

As shown in FIG. 2, each light emitting unit 13 includes a light emitting element 31 and a sealing portion 32, and forms a pixel of the display device 10. The light emitting element 31 is a single-color LED, a two-color LED of red (R) and green (G), or a three-color LED of red (R), green (G), and blue (B), for example. In a case where the display device 10 is a full-color display device, three-color LEDs are used as the light emitting units 13.

The light emitting units 13 are two-dimensionally arranged in the x-axis direction and the y-axis direction at regular intervals on the surface of the circuit board 11. Each of the light emitting units 13 arranged in this manner is surrounded by the light absorbing unit 12. Each light emitting element 31 is preferably provided in each corresponding opening 12a. More specifically, the light emitting elements 31 are preferably provided at substantially the same height as the back surface of the light absorbing unit 12, or in higher positions than the back surface, when seen from the perpendicular direction of the display surface 10s. With this arrangement, the openings 12a can be made smaller than those in a case where the light emitting elements 31 are provided in deeper positions than the back surface of the light absorbing unit 12. Accordingly, the opening rate can be made lower, and photopic contrast can be improved. Also, high-precision alignment is not required as in the case where the light emitting elements 31 are provided in deeper positions than the back surface of the light absorbing unit 12. Accordingly, the allowable range of alignment errors can be widened, and the yield can be improved.

The sealing portions 32 seal the light emitting elements 31 by covering the light emitting elements 31 provided on the surface of the circuit board 11. The sealing portions 32 are made of a transparent resin material or an almost transparent resin material that diffusely transmits light, for example.

The upper surface of each sealing portion 32 (or each of the surfaces constituting the display surface 10s) is a flat surface, a curved surface, or a corrugated surface, for example. The curved surface is a convex or concave curved surface with respect to the front surface of the circuit board 11, or more preferably, is a convex curved surface. This is because light emitted from the light emitting element 31 can be spread and widened by the convex curved surface, and the field of view can be improved accordingly. The convex curved surface may be a partial spherical surface, a dome-like surface, or an adjustable surface, for example. Here, a partial spherical surface means a shape formed by cutting out part of a sphere. A partial spherical surface may be an almost partial spherical surface. An almost partial spherical surface means a shape formed by distorting a partial spherical surface so as not to greatly degrade optical characteristics.

(Low-Reflection Layers)

As shown in FIG. 2, a low-reflection layer 14a and a low-reflection layer 14b are provided on the surfaces of the light absorbing unit 12 and the sealing portion 32, respectively. The low-reflection layer 14a is formed along the finely corrugated surface 12s of the light absorbing unit 12. The low-reflection layer 14b is formed along the upper surface of the sealing portion 32. With this, external light reflection from the sealing portion 32 and the light absorbing unit 12 is reduced.

The low-reflection layers 14a and 14b preferably contain a low refractive index material having a refractive index n of 1.5 or lower as a principal component. This is because, with this material, the refractive index of the low-reflection layers 14a and 14b can be made an intermediate refractive index between the refractive index of air and the refractive index of the sealing portion 32 and the light absorbing unit 12. The low refractive index material may be a fluorine-based resin, porous particles such as porous silica particles, or hollow particles such as hollow silica particles, for example. One of these materials may be used, or two or more of these materials may be used in combination. Here, the porous particles and the hollow particles are nanoparticles having a particle size equal to or smaller than the wavelength of light. So as to improve drip-proof properties, antifouling properties, easiness to wipe off fingerprints, and the like, a fluorine-based resin is preferably used as the low refractive index material.

As for each of the low-reflection layers 14a and 14b, it is also possible to use a layer formed by stacking a first layer that contains porous particles and has a thickness of $\lambda/(4 \cdot n)$, and a second layer that contains a fluorine-based resin and has a thickness one digit smaller than the wavelength of light (the thickness being approximately 10 nm, for example). In this case, the second layer is the outermost surface layer. As the low-reflection layers 14a and 14b each having the above structure are used, the reflectance is lowered, and a positive effect not related to optical characteristics, such as drip-proof properties, antifouling properties, or easiness to wipe off fingerprints, can also be provided.

The low-reflection layers 14a and 14b are preferably low-reflection coating layers produced by a wet process. As the low-reflection layers 14a and 14b are produced by a wet process, the costs for raw materials and facilities can be made less expensive than in the case where the low-reflection layers 14a and 14b are produced by a dry process such as sputtering.

The low-reflection layers 14a and 14b are fluorine-containing low-reflection layers, porous low-reflection layers, or fluorine-containing porous low-reflection layers, for example. Fluorine-containing low-reflection layers are low-reflection layers containing fluororesin. Porous low-reflection layers are low-reflection layers each having a porous structure, and contain at least one of porous particles such as porous silica particles, and hollow particles such as hollow silica particle, for example. Fluorine-containing porous low-reflection layers are low-reflection layers that contain fluororesin, and each have a porous structure formed with porous particles or the like.

In view of the fact that the low-reflection layers 14a and 14b with excellent uniformity are produced by a wet process, the thickness of each of the low-reflection layers 14a and 14b is preferably equal to or greater than the wavelength $\lambda$ of incident light designed to reduce reflection. So as to reduce reflection of external light, on the other hand, the thickness of each of the low-reflection layers 14a and 14b is preferably $\lambda/(4 \cdot n)$ ($\lambda$: the wavelength of incident light designed to reduce reflection, n: the refractive index of each of the low-reflection layers 14a and 14b). Reflected light between the air and the low-reflection layer 14a, and reflected light between the low-reflection layer 14a and the light absorbing unit 12 can be made to interfere with each other, and cancel each other eventually, a half-wavelength difference existing in between ($\lambda/2$ in air). Accordingly, an optimum reflection reducing condition is realized. Also, reflected light between the air and the low-reflection layer 14b, and reflected light between the low-reflection layer 14b and the sealing portion 32 can be made to interfere with each other, and cancel each other eventually, a half-wavelength difference existing in between ($\lambda/2$ in air). Accordingly, an optimum reflection reducing condition is realized. The wavelength band of light designed to reduce reflection is the wavelength band of visible light. Here, the wavelength band of visible light is the wavelength band from 360 nm to 830 nm.

(Circuit Board)

As shown in FIG. 2, the circuit board 11 includes a substrate 21, a wiring layer 22 provided on the surface of the substrate 21, a planarizing film 23 provided on the surface of the wiring layer 22, and drive Integrated Circuits (ICs) 24 provided on the surface of the planarizing film 23.

A resin substrate or a glass substrate, for example, can be used as the substrate 21. Examples of resin substrate materials include polycarbonate, polyethylene, polypropylene, polyvinyl chloride, polystyrene, polyethylene terephthalate, polyethylene naphthalate, methacrylic resin, nylon, polyacetal, fluororesin, phenolic resin, polyurethane, epoxy resin, polyimide resin, polyamide resin, melamine resin, polyetheretherketone, polysulfone, polyether sulfone, polyphenylene sulfide, polyarylate, polyetherimide, polyamideimide, and methyl methacrylate (co)polymer. Examples of glass substrate materials include soda-lime glass, lead glass, hard glass, silica glass, liquid crystal glass, and glass epoxy.

The wiring layer 22 includes a wire provided on the surface of the substrate 21. Through this wire, the drive ICs 24 are connected to a driver IC that is not shown in the drawings. The drive ICs 24 are controlled by control signals from the driver IC. The planarizing film 23 is the film for planarizing the surface of the substrate 21 on which the wiring layer 22 is provided.

The drive ICs 24 are provided to correspond to the light emitting units 13, and one drive IC 24 and one light emitting unit 13 form one set. The drive ICs 24 are covered with the light absorbing unit 12. The lighting operation and the like of the light emitting units 13 are controlled by the drive ICs 24.

1.2 Large-Screen Display Device

Figure 3:
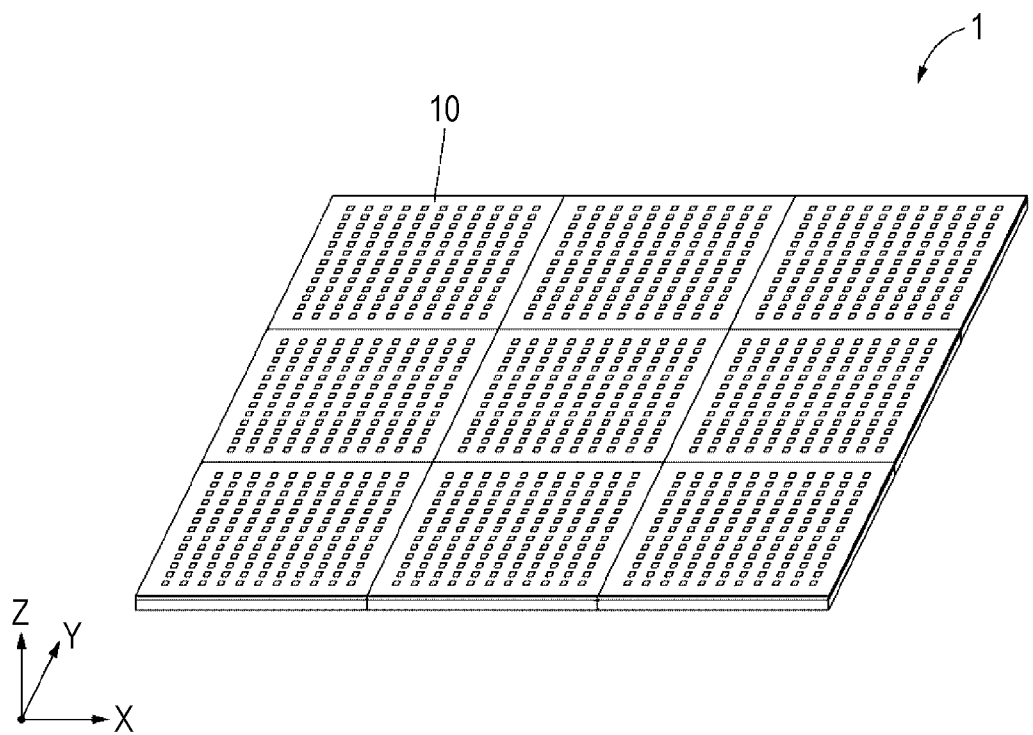
FIG. 3 is a perspective view of an example structure of a large-screen display device according to the first embodiment of the present technology.

As shown in FIG. 3, a large-screen display device 1 according to the first embodiment of the present technology includes display devices (display cells) 10 according to the above described first embodiment. This large-screen display device 1 is a tiling display produced by two-dimensionally arranging the display devices 10 like tiles. Although FIG. 3 shows an example where the large-screen display device 1 is formed with nine display devices 10, the number of display devices 10 forming the large-screen display device 1 is not limited to this example, and the large-screen display device 1 may be formed with several tens or several hundreds of display devices 10.

1.3 Functions of the Display Surface of a Display Device

Figure 4:
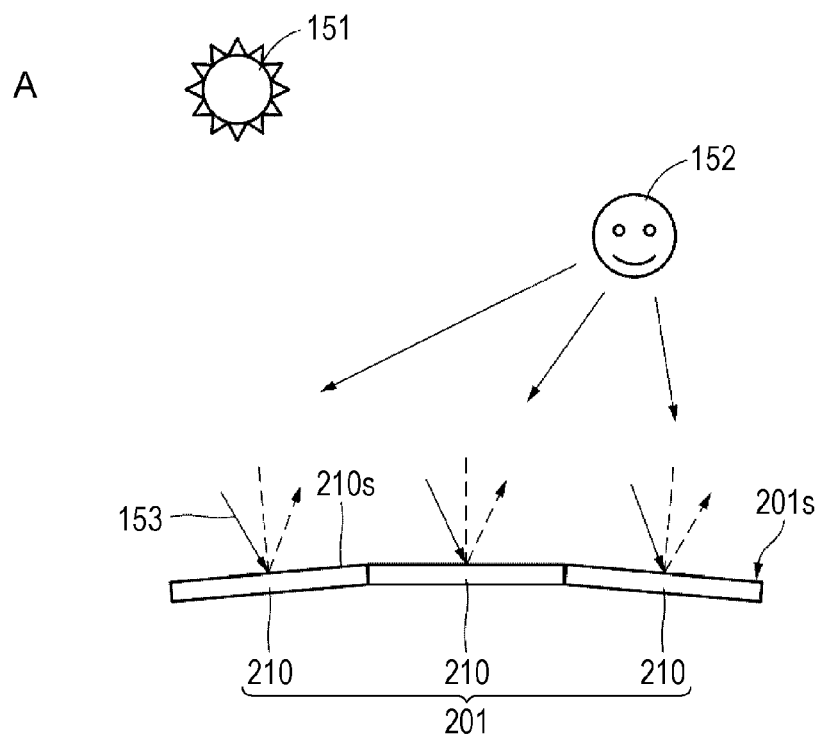
FIG. 4A is a schematic diagram for explaining the functions of a large-screen display device as a comparative example.
FIG. 4B is a schematic diagram for explaining the functions of a large-screen display device according to the first embodiment of the present technology.
Figure 4:
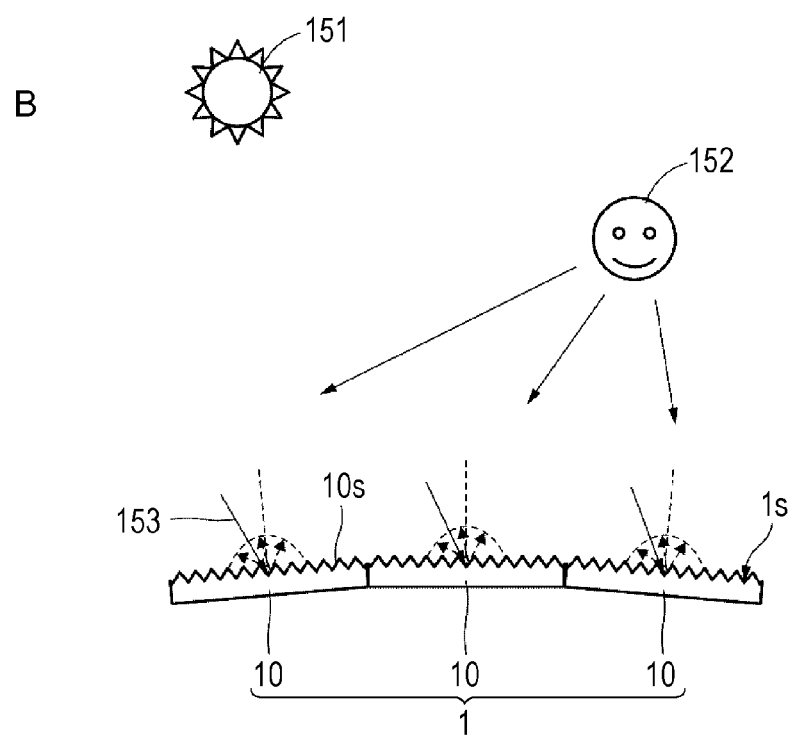

Referring now to FIGS. 4A and 4B, the functions of the display surface 10s of a display device 10 having the above described structure are described.

Figure 5:
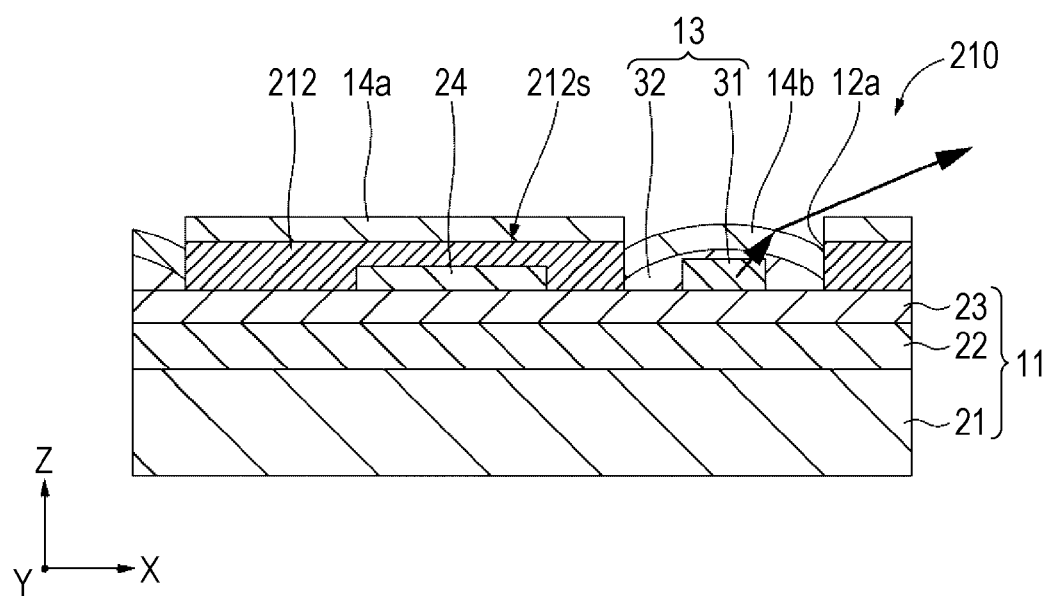
FIG. 5 is a schematic diagram showing the structure of a display device as a comparative example.

FIG. 4A shows an example where a large-screen display device 201 is formed with display devices 210 as a comparative example. As shown in FIG. 5, each of these display devices 210 is the same as the display device 10 (see FIG. 2) according to the first embodiment, except that a light absorbing unit (a gloss black-colored layer) 212 having a flat surface 212s is employed in place of the light absorbing unit (a matte black-colored layer) 12 having the finely corrugated surface 12s. That is, a display surface 210s formed with the surfaces of the light absorbing unit 212 and light emitting units 13 is employed in place of the display surface 10s formed with the surfaces of the light absorbing unit 12 and the light emitting units 13. Meanwhile, FIG. 4B shows an example where the large-screen display device 1 is formed with display devices 10 according to the first embodiment of the present technology. Each of these display devices 10 includes the light absorbing unit (a matte black-colored layer) 12 having the finely corrugated surface 12s, as shown in FIG. 2.

As shown in FIG. 4A, in each display device 210 as a comparative example, when external light 153 from a light source 151 such as the sun enters the flat surface 212s of the light absorbing unit 212, part of the external light 153 is absorbed by the light absorbing unit 12, and the remaining light of the external light 153 is specularly-reflected by the flat surface of the flat surface 212s.

The display surface 201s of the large-screen display device 20l is preferably a flat surface, but the display surface 201s might be slightly curved in relation to the placement accuracy at the time when the display devices 210 are arranged. If there is such a curve, the direction in which light is specularly-reflected by the flat surface 212s of the light absorbing unit 212 varies among the respective display devices 210 forming the large-screen display device 201. If there is such variation, the respective display devices 210 forming the large-screen display device 201 look different to a user 152.

Meanwhile, as shown in FIG. 4B, in each display device 10 according to the first embodiment, when external light 153 from the light source 151 such as the sun enters the finely corrugated surface 12s of the light absorbing unit 12, part of the external light 153 is absorbed by the light absorbing unit 12, but the remaining light of the external light 153 is diffusely-reflected by the finely corrugated surface 12s of the light absorbing unit 12. With this, the reflected light in every direction has almost the same luminance. Accordingly, even in a case where the display surface is slightly curved, the respective display devices 10 forming the large-screen display device 1 look almost the same to the user 152.

1.4 Method of Manufacturing a Display Device

Referring now to FIGS. 6A through 6D, and FIGS. 7A and 7B, an example method of manufacturing a display device according to the first embodiment of the present technology is described.

(Wiring Layer Forming Process)

Figure 6:
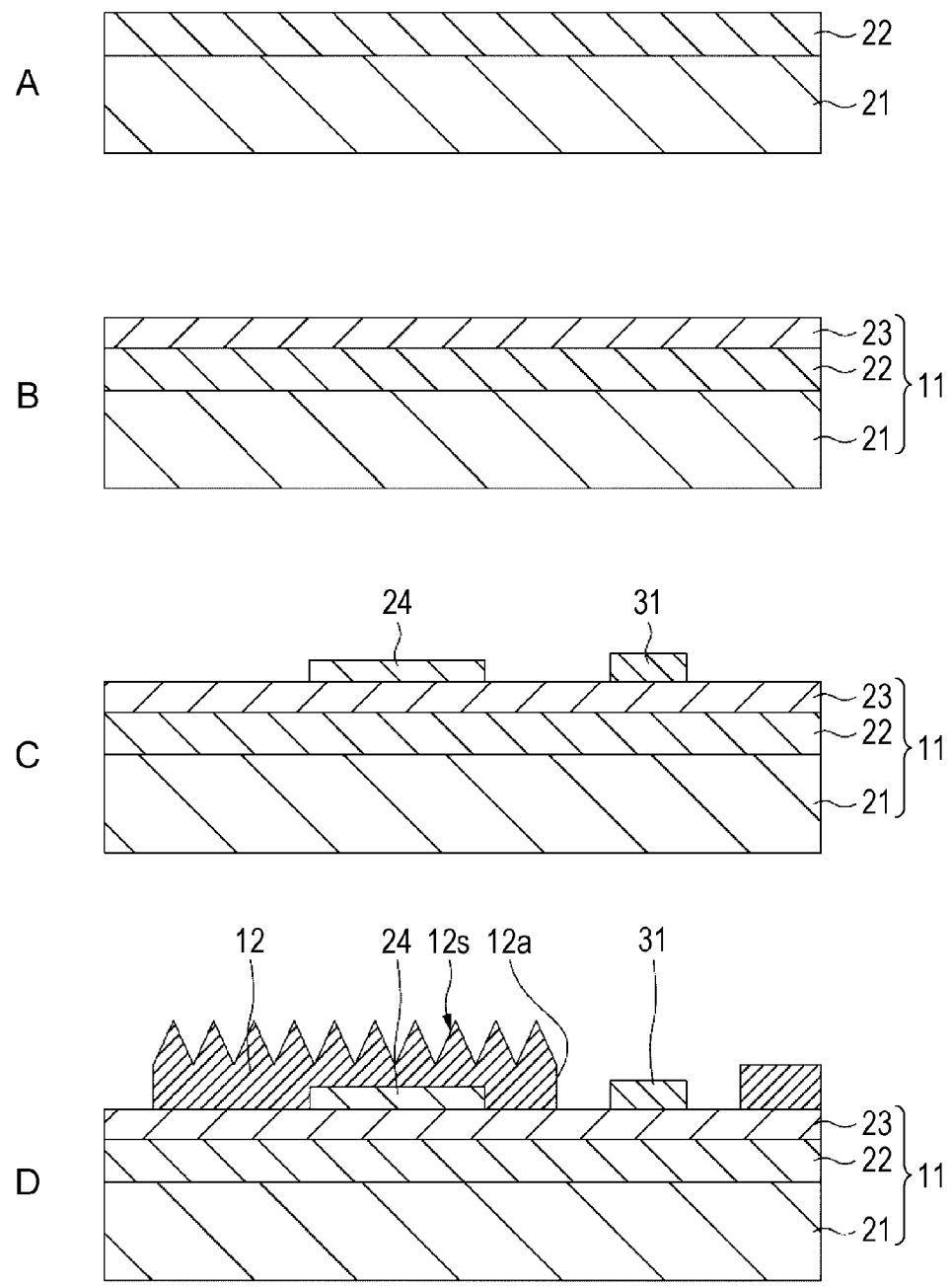
FIGS. 6A through 6D are process diagrams for explaining an example method of manufacturing a display device according to the first embodiment of the present technology.

First, as shown in FIG. 6A, the wiring layer 22 is formed on the surface of the substrate 21.

(Planarizing Film Forming Process)

As shown in FIG. 6B, the planarizing film 23 is then formed on the surface of the wiring layer 22.

(Process of Forming the Light Emitting Elements and the Drive ICs)

As shown in FIG. 6C, the light emitting elements 31 and the drive ICs 24 are formed at predetermined positions on the surface of the planarizing film 23.

(Process of Forming the Light Absorbing Unit)

A matrix-like coating film made from a resin composition for forming a light absorbing unit is then formed on the surface of the planarizing film 23 by a printing technique, for example. The printing technique may be inkjet printing, offset printing, or screen printing, for example. The resin composition for forming a light absorbing unit is a resin composition containing black particles such as carbon black. This resin composition contains one or more compositions selected from the group consisting of an air-setting resin composition, an energy beam curable resin composition, and a thermosetting resin composition.

Here, an energy beam curable resin composition means a resin composition that can be hardened by irradiation of energy beams. The energy beams are energy beams that can trigger a radical, cation, or anion polymerization reaction, such as electron beams, ultraviolet rays, infrared rays, laser beams, visible rays, ionizing radiation (such as X-rays, α-rays, β-rays, and γ-rays), microwaves, and high-frequency waves. An ultraviolet curable resin composition that is hardened by ultraviolet rays is preferably used as the energy beam curable resin composition. An air-setting resin means a resin composition that can be hardened by natural drying.

In a case where the resin composition for forming a light absorbing unit contains a solvent, the coating film is dried, so that the solvent is vaporized. In a case where the resin composition for forming a light absorbing unit is an air-setting resin composition, the coating film is hardened in this process, and the light absorbing unit 12 having the openings 12a is formed on the surface of the planarizing film 23 as shown in FIG. 6D.

In a case where the resin composition for forming low-reflection layers contains at least one of an energy beam curable resin composition and a thermosetting resin composition, the coating film is subjected to energy beam irradiation or a heating treatment, so that the coating film is hardened. With this, the light absorbing unit 12 having the openings 12a is formed on the surface of the planarizing film 23 as shown in FIG. 6D.

The method of forming the finely corrugated surface 12s on the surface of the light absorbing unit 12 may be a method by which fine particles are provided beforehand in the resin composition for forming a light absorbing unit, and the surfaces of the fine particles are made to protrude from the surface of the light absorbing unit 12, a method of transferring recesses onto the resin composition for forming a light absorbing unit by molding, or a method of forming recesses in the surface of the light absorbing unit 12 by sandblasting, for example.

(Sealing Portion Forming Process)

Figure 7:
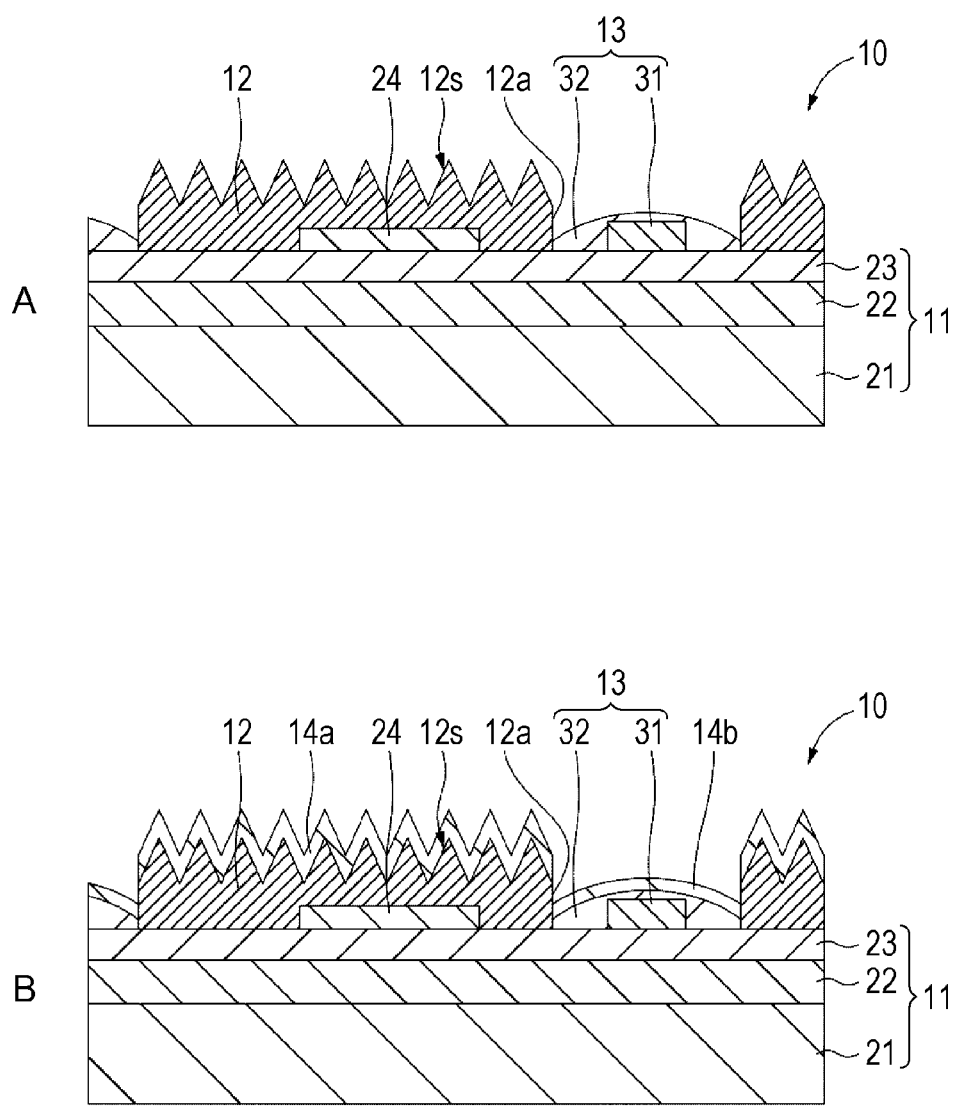
FIGS. 7A and 7B are process diagrams for explaining an example method of manufacturing a display device according to the first embodiment of the present technology.

After a sealing material is applied to the openings 12a, the sealing material is hardened by energy beam irradiation or a heating treatment. As a result, the sealing portions 32 are formed in the openings 12a, as shown in FIG. 7A. As for the method of applying the sealing material, it is possible to use ink jet printing, offset printing, screen printing, a dispenser, or a jet dispenser, for example. As for the sealing material, one or more materials selected from the group consisting of an energy beam curable resin composition and a thermosetting resin composition can be used, and, in view of heat resistance and the like, a silicone resin such as modified silicone is preferable.

(Low-Reflection Layer Forming Process)

The resin composition for forming low-reflection layers is then applied almost evenly along the finely corrugated surface 12s of the light absorbing unit 12 and the upper surfaces of the sealing portions 32, so that a coating film is formed. The coating method that can be used here is a spin coating method, a spray coating method, a slit coating method, a bar coating method, a dip coating method, a die coating method, a gravure coating method, a knife coating method, a resist coating method, a capillary coating method, or the like. In a case where a spray coating method is used as the coating method, the resin composition can be applied in a non-contact manner, and accordingly, continuous coating that does not depend on the shapes of the recesses in the display surface 10s can be performed. Also, scatter of the resin composition into ambient air at the time of application can be reduced, and the low-reflection layers 14a and 14b with excellent uniformity in thickness can be formed. In a case where a spray coating method is used as the coating method, a coating film can be formed simultaneously on the surfaces of the light absorbing unit 12 and the sealing portions 32.

In a case where a spray coating method is used as the coating method, a coating material is prepared by diluting a fluorine-based resin to approximately 0.5%. The prepared coating material is applied in such a manner that the thickness of the applied material becomes approximately 20 μm in a wet state (prior to drying). In this manner, the film thickness after hardening can be made approximately 100 nm.

The resin composition for forming low-reflection layers is a resin composition containing one or more materials selected from the group consisting of a fluorine-containing compound (hereinafter referred as to a "fluorine-based compound"), porous particles, and hollow particles. This resin composition contains one or more compositions selected from the group consisting of an air-setting resin composition, an energy beam curable resin composition, and a thermosetting resin composition.

In a case where the resin composition contains a solvent, the coating film is dried as necessary, so that the solvent is vaporized. In a case where the resin composition for forming low-reflection layers is an air-setting resin composition, the coating film is hardened in this process, and the low-reflection layers 14a and 14b are formed on the surfaces of the light absorbing unit 12 and the sealing portions 32, respectively, as shown in FIG. 7B.

In a case where the resin composition for forming low-reflection layers contains at least one of an energy beam curable resin composition and a thermosetting resin composition, the coating film is subjected to energy beam irradiation or a heating treatment, so that the coating film is hardened. With this, the low-reflection layers 14a and 14b are formed on the surfaces of the light absorbing unit 12 and the sealing portions 32, respectively, as shown in FIG. 7B.

In the above described manner, an intended display device 10 is obtained.

[Effects]

In the first embodiment, each of the light emitting units 13 is surrounded by the light absorbing unit 12. Accordingly, contrast can be improved. Also, the low-reflection layer 14a is formed on the finely corrugated surface 12s of the light absorbing unit 12 of each display device 10. Accordingly, diffuse reflection of external light on the finely corrugated surface 12s can be reduced. Also, the low-reflection layers 14b are formed on the upper surfaces of the light emitting units 13 of each display device 10. Accordingly, external light reflection on the upper surfaces of the light emitting units 13 can be reduced.

The light emitting elements 31 are provided in the openings 12a, and the sealing portions 32 seal the light emitting elements 31 in the openings 12a. Accordingly, there is no need to form a sealing layer on the entire interface between the surface of the circuit board 11 and the light absorbing unit 12. Thus, the display device 10 can be made thinner.

2. Second Embodiment 2.1 Structure of a Display Device

Figure 8:
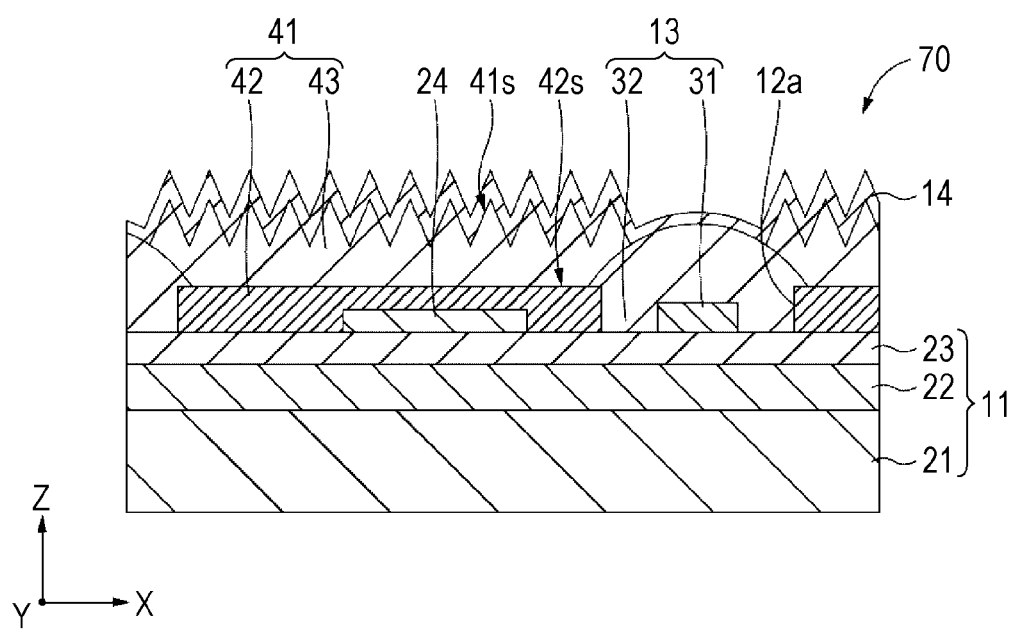
FIG. 8 is a cross-sectional view of an example structure of a display device according to a second embodiment of the present technology.

As shown in FIG. 8, a display device 70 according to a second embodiment of the present technology differs from the display device 10 according to the first embodiment, in including a light absorbing unit 41 having a two-layer structure. The light absorbing unit 41 includes a light absorbing layer 42 having a flat surface 42s, and a diffusion layer (a shaped layer) 43 provided on the flat surface 42s. Also, the upper surfaces of the sealing portions 32 may cover the rims of the openings 12a.

The light absorbing layer 42 is the same as the light absorbing unit 12 of the first embodiment, except for including the flat surface 42s, instead of the finely corrugated surface 12s.

The diffusion layer 43 has a finely corrugated surface 41s that diffuses light. The diffusion layer 43 contains fine particles and a resin material. The finely corrugated surface 41s is formed with the fine particles. More specifically, the finely corrugated surface is formed by causing the surfaces of the fine particles to partially protrude from the surface of the diffusion layer 43. A low-reflection layer 14 is formed along the finely corrugated surface 41s of the diffusion layer 43 and the upper surfaces of the sealing portions 32. As for the fine particles, the same fine particles as those contained in the light absorbing unit 12 of the above described first embodiment can be used.

2.3 Method of Manufacturing a Display Device

A method of manufacturing a display device according to the second embodiment of the present technology is the same as the above described method according to the first embodiment until the process of forming the light absorbing layer. Therefore, only the process thereafter will be described below, with reference to FIGS. 9A through 9C.

(Sealing Portion Forming Process)

Figure 9:
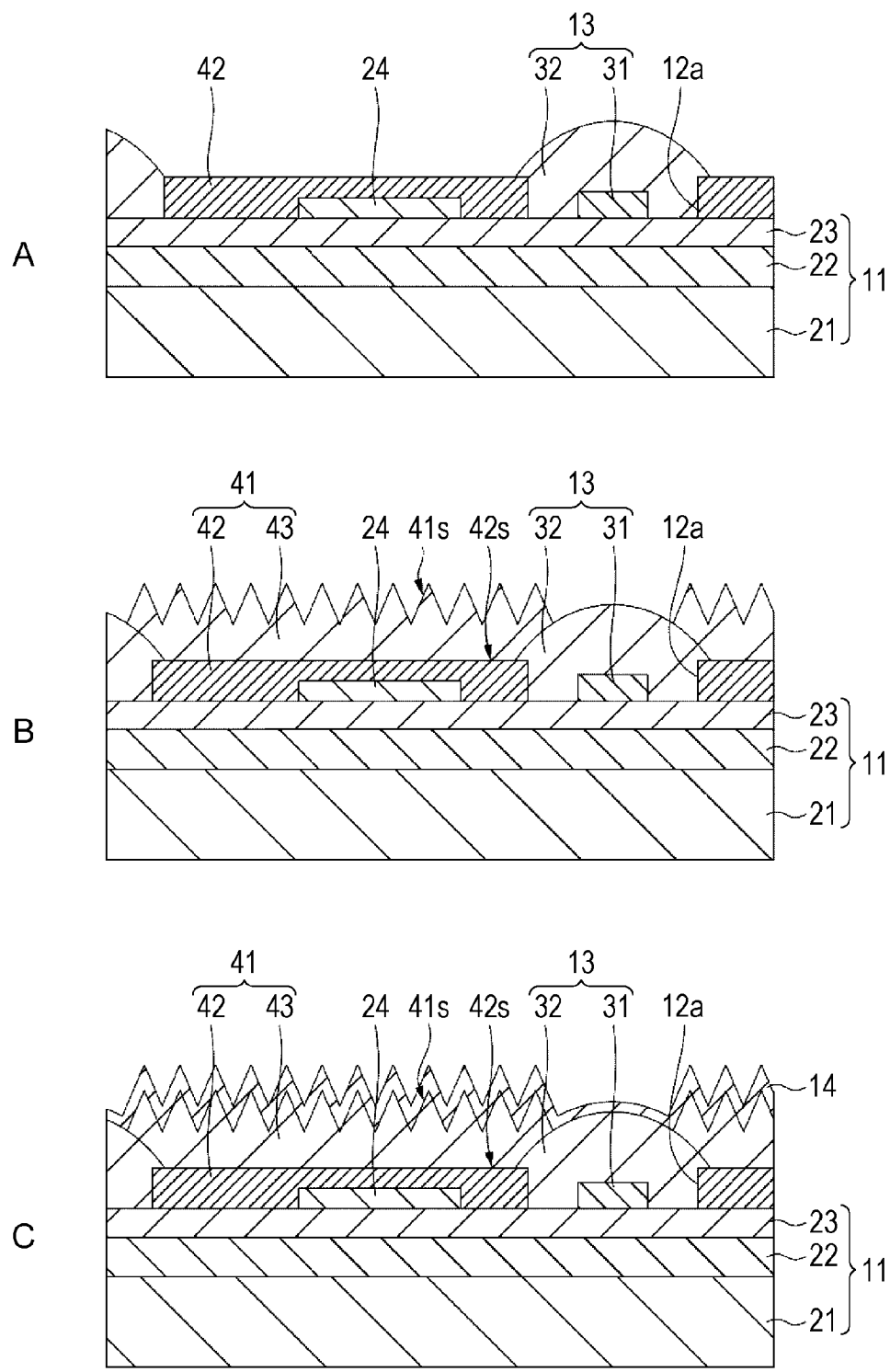
FIGS. 9A through 9C are process diagrams for explaining an example method of manufacturing a display device according to the second embodiment of the present technology.

First, a sealing material is applied to the openings 12a. The sealing material is applied so that the upper surface of the sealing material covers the rims of the openings 12a. The applied sealing material is then subjected to energy beam irradiation or a heating treatment, and is hardened. As a result, the sealing portions 32 are formed in the openings 12a, as shown in FIG. 9A.

(Diffusion Layer Forming Process)

A resin composition and fine particles, as well as a solvent if necessary, are mixed, to prepare a coating material having the fine particles dispersed therein. At this point, an additive such as a light stabilizer, an ultraviolet absorber, an antistatic agent, a flame retardant, or an antioxidant may be further added as necessary. The resin composition contains at least one of an energy beam curable resin composition and a thermosetting resin composition. A matrix-like coating film made from the prepared coating material is then formed on the light absorbing layer 42 by a printing technique, for example.

In a case where the resin composition contains a solvent, the resin composition is dried as necessary, so that the solvent is vaporized. The drying condition is not particularly limited, and may be natural drying, or artificial drying with an adjusted drying temperature and an adjusted drying time. However, in a case where air is blown onto the surface of the coating material at the time of drying, no wind ripples are preferably formed in the surface of the coating film. The drying temperature and the drying time can be appropriately determined by the boiling point of the solvent contained in the coating material. In such a case, the drying temperature and the drying time are preferably determined within such a range that the substrate 21 will not be deformed due to thermal contraction, with the heat resistance of the substrate 21 being taken into consideration.

The applied sealing material is then subjected to energy beam irradiation or a heating treatment, and is hardened. As a result, the diffusion layer 43 is formed on the flat surface 42s of the light absorbing layer 42, as shown in FIG. 9B.

(Low-Reflection Layer Forming Process)

The resin composition for forming low-reflection layers is then applied almost evenly along the finely corrugated surface 41s of the diffusion layer 43 and the upper surfaces of the sealing portions 32, so that a coating film is formed. Energy beam irradiation or a heating treatment is then performed on the coating film, so that the coating film is hardened. As a result, the low-reflection layer 14 is formed along the finely corrugated surface 41s of the diffusion layer 43 and the upper surfaces of the sealing portions 32, as shown in FIG. 9C.

In the above described manner, an intended display device 10 is obtained.

3. Third Embodiment 3.1 Outline

In a display device or a display panel, if there is variation in the optical characteristics in the screen, the display becomes uneven. This is because structural variation is caused microscopically at each pixel unit during a process. It is difficult to avoid such variation. Particularly, the problem that light distribution properties vary among the pixels is one of serious problems. So as to achieve a screen that looks uniform from every direction, uniform light distribution properties need to be obtained at the respective pixel units with high precision on the entire display screen. In the production of display devices of various types such as liquid crystal types and organic EL types, in-plane uniformity is expected. However, it is difficult to achieve complete uniformity when seen not only from a vertical direction but from every direction. It is considered that optical properties vary primarily due to a limit on the in-plane uniformity among materials and processes. Even in an LED display device formed by arranging millions of minute LEDs as individual pixel structures, there is the same problem as above primarily due to the light distribution properties of the respective LEDs and the variation among the LED installation processes. So as to allow those limits on processes, there is a demand for a novel light distribution control structure to stabilize light distributions in a panel structure, and a method of improving the yield of such display devices.

In a display device in which LCDs, organic ELs, or LEDs are arranged as pixels, if the shape of the pixels changes only slightly, a change is caused in the internal optical path, and, as a result, the light distribution properties at the time of light extraction significantly vary. Such variation in light distribution properties lead directly to in-plane variation in the display device, resulting in a serious problem of unevenness of the display device screen and the problem of low yield at a time of mass production. In view of this, a third embodiment concerns a technique for securing in-plane uniformity in a display device as the in-plane light distribution properties of the display device by providing alight distribution control structure that stabilizes light distributions in the display device so as to sever the relation between the light distribution properties that vary among the pixels and the pre-processing causing the variation.

3.2 Structure of a Display Device

Figure 13:
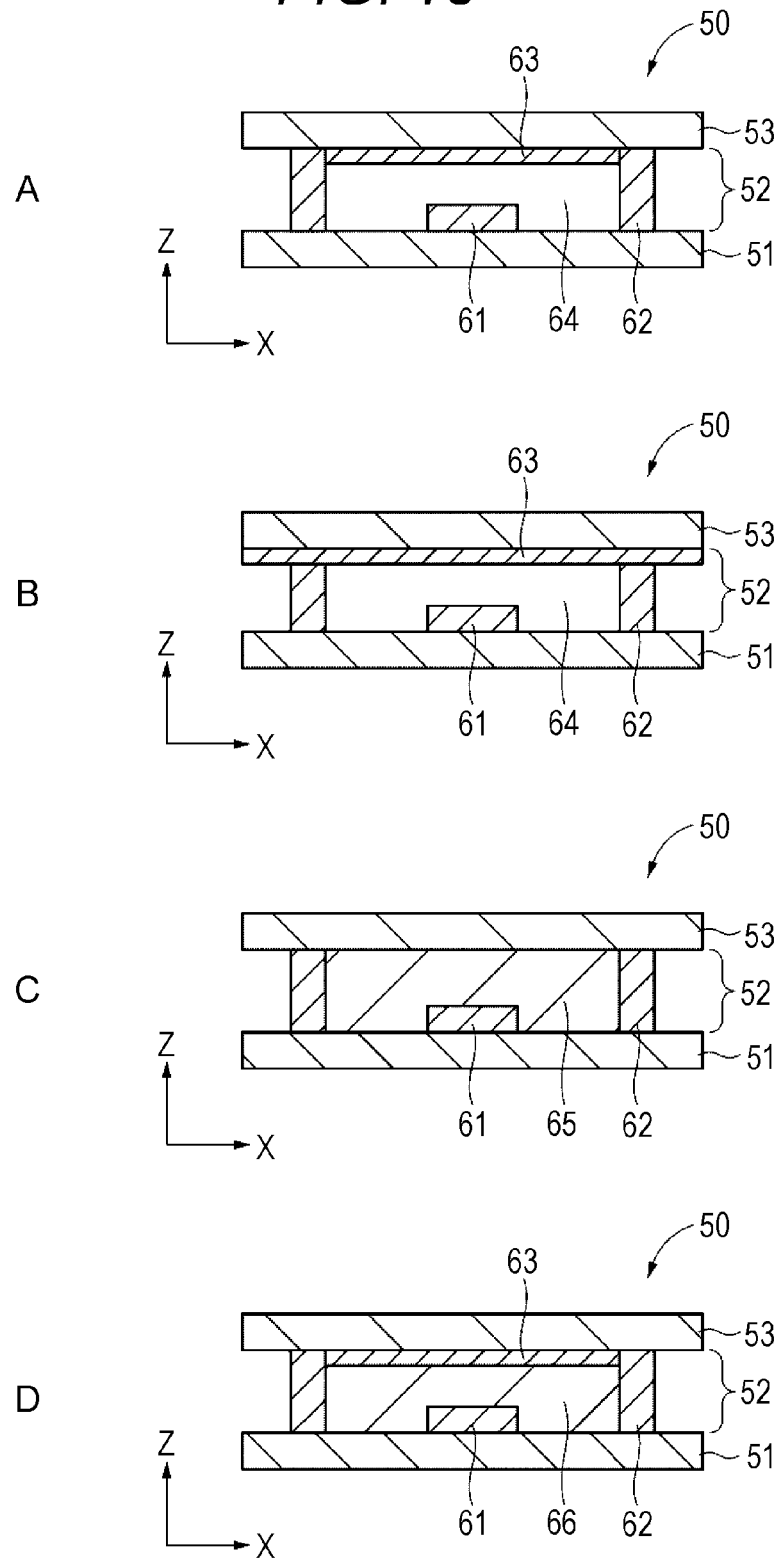
FIG. 13A is a cross-sectional view of an example structure of a display device according to a third embodiment of the present technology.
FIGS. 13B through 13D are cross-sectional views of example structures of display devices according to modifications of the third embodiment of the present technology.
Figure 14:
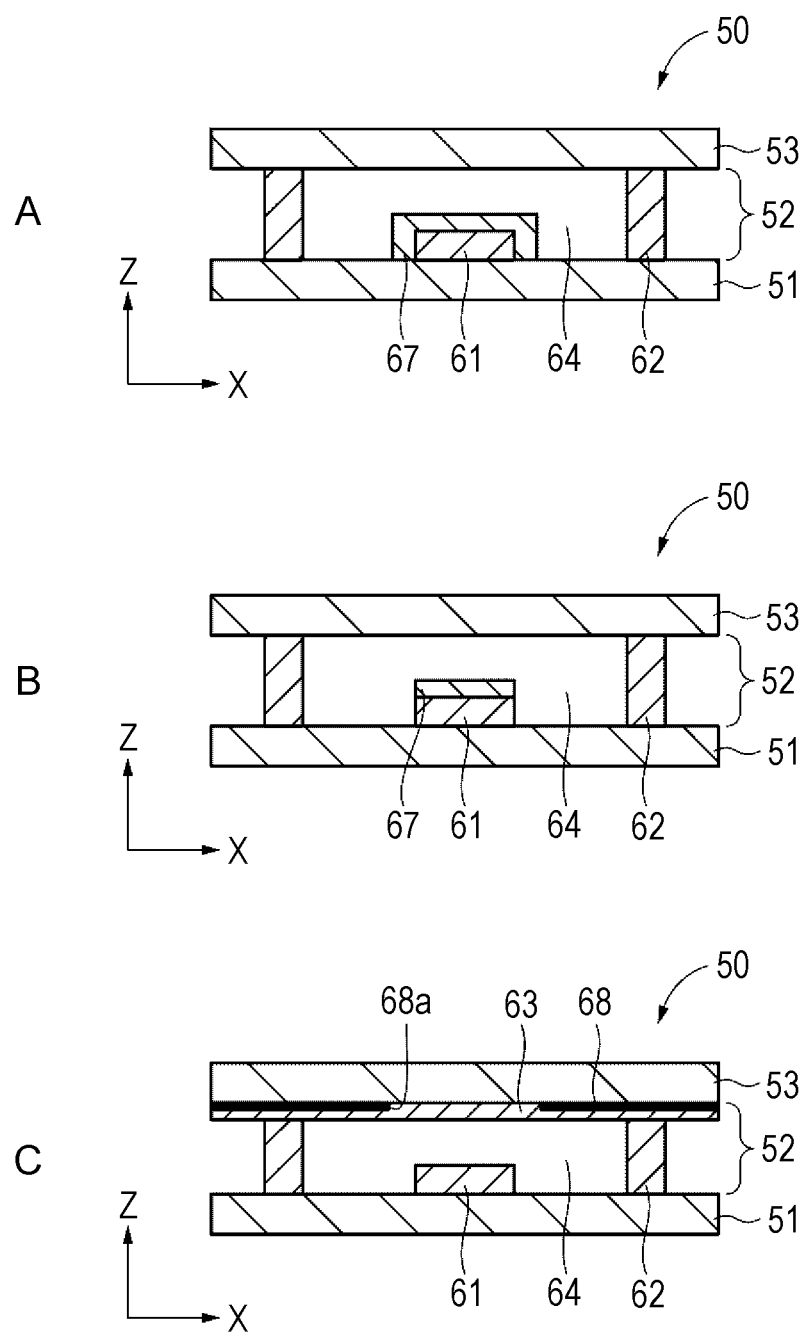
FIGS. 14A through 14C are cross-sectional views of example structures of display devices according to modifications of the third embodiment of the present technology.

As shown in FIG. 13A, a display device 50 according to the third embodiment includes a circuit board 51, light emitting units 52, and a cover glass 53. The light emitting units 52 are two-dimensionally arranged at regular intervals on the surface of the circuit board 51. The cover glass 53 is positioned to face toward the circuit board 51, and cover the light emitting units 52. These components will be described below one by one.

(Circuit Board)

The circuit board 51 is the same as the circuit board 51 of the above described first embodiment.

(Light Emitting Units)

The light emitting units 52 each include a light emitting element 61, a light reflection layer 62, a light diffusion layer 63, and a hollow portion 64. The light emitting element 61 is the same as each light emitting element 31 of the above described first embodiment. The light reflection layer 62 is provided to surround the light emitting element 61. The light reflection layer 62 reflects light emitted from the light emitting element 61. The hollow portion 64 is a hollow space enclosed by the circuit board 51, the light reflection layer 62, and the cover glass 53. The gaseous matter that fills the hollow portion 64 may be air or a predetermined gas, for example.

The light diffusion layer 63 is provided on the principal surface facing toward the circuit board 51, of the two principal surfaces of the cover glass 53. The light diffusion layer 63 has a function to diffuse light emitted from the light emitting element 61 or light reflected by the light reflection layer 62. The light diffusion layer 63 has a light-diffusing transmission structure.

The light diffusion layer 63 is formed by processing the surface of the cover glass 53, for example. The cover glass 53 having such a structure may be formed with processed glass, such as opaque glass, etched glass, frosted glass, unwoven glass, or opal glass. Examples of methods of processing such glass include a sandblasting technique by which hard grains such as sand are blown onto a glass surface at high speed, and an etching technique involving glass melting with acid. Light diffusion properties can be controlled by adjusting the process amounts (such as speed and time) in the glass processing.

When the display device 50 is seen from the z-axis direction, the light diffusion layer 63 preferably covers the light emitting element 61. More specifically, in a case where the size of one side of the light emitting element 61 is approximately 10 µm to several hundreds of µm, the size of one side of the light diffusion layer 63 is preferably equal or greater than that. The light diffusion layer 63 does not necessarily have a great thickness, and may be a very thin layer of approximately 5 µm, for example.

The surface of the above mentioned processed glass has a finely corrugated structure, and its microscopic structure can be regarded as fine particles. The two-dimensional particle size or the intervals between the particles when the glass surface is observed from a direction perpendicular to the surface are in the range of several µm to several tens of µm, for example. Also, the depth is in the range of several hundreds of nm to several µm. Normally, as the particle size or the intervals become smaller, and the depth becomes greater, the linear transmission component of transmitted light tends to become weaker, and the diffuse component tends to become stronger.

Also, the light diffusion layer 63 may be formed on the surface of the cover glass 53, for example. Examples of methods of forming the light diffusion layer 63 include a method by which a coating material is prepared by stirring fine particles in a transparent resin material serving as a binder, and the coating material is applied onto and hardened on the surface of the cover glass 53.

3.3 Method of Forming the Light Diffusion Layer

An example method of forming the light diffusion layer 63 on the surface of the cover glass 53 is now described in detail. First, a coating material is prepared by stirring fine particles in a transparent resin material serving as a binder. In the stirring, it is preferable to use a stirring device that can efficiently stir the coating material in a short time, with only a small aggregate of the fine particles. Such a stirring device may be a centrifugal stirring machine of a self-rotation type, for example. The stirred coating material is preferably milled with a bead mill or a triple roll mill. This is because, even in a case where a small aggregate of the fine particles is created as a result of the stirring, the aggregate is pulverized, and a homogeneous slurry can be obtained while a desired density is maintained.

As the ratio of the fine particles to the binder and/or the thickness of the light diffusion layer 63 is adjusted, the light diffusion function of the light diffusion layer 63 can be controlled. The binder may be a two-component thermosetting silicone resin, for example. Examples of the materials of the fine particles include melamine, silica, alumina, and titanium oxide. The fine particles that are used here have a certain particle size maintained within the range of several hundreds of nm to several µm, for example.

The prepared coating material is then applied onto the surface of the cover glass 53, so that a coating film is formed. The coating method that is used here may be dispensing coating, or a printing process such as screen printing, for example. The thickness of the light diffusion layer 63 can be adjusted by setting a control parameter for the printing process, for example. For example, in screen printing, a plate mesh size and an opening rate can be selected so that the coating thickness can be stably maintained at 5 µm or 30 µm.

The coating film on the surface of the cover glass 53 is then hardened. The hardening method is selected in accordance with the type of the transparent resin material contained in the coating material. In a case where the transparent resin material is a thermosetting resin, for example, the coating film can be hardened through firing at several hundreds of degrees centigrade for several hours.

3.4 Effects

Figure 15:
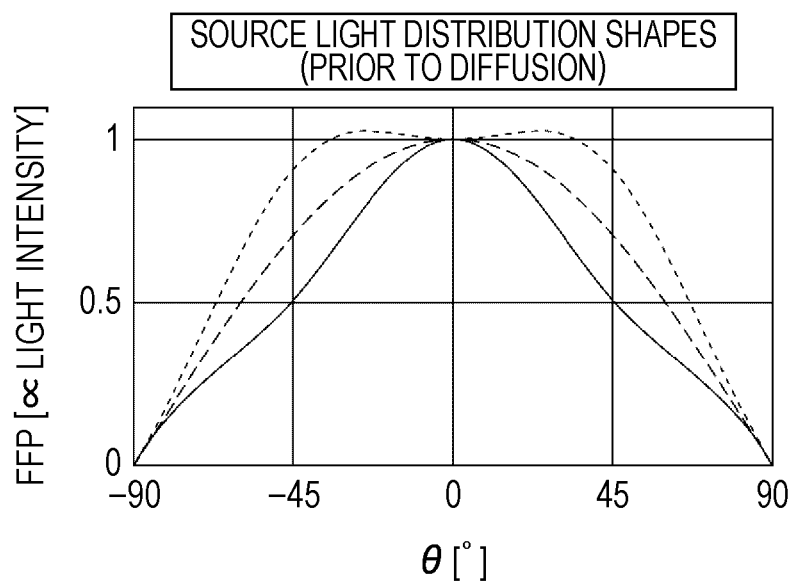
FIG. 15A is a diagram showing an FFP in a case where any diffusion layer is not provided.
FIG. 15B is a diagram showing an FFP in a case where a diffusion layer is provided.
Figure 15:
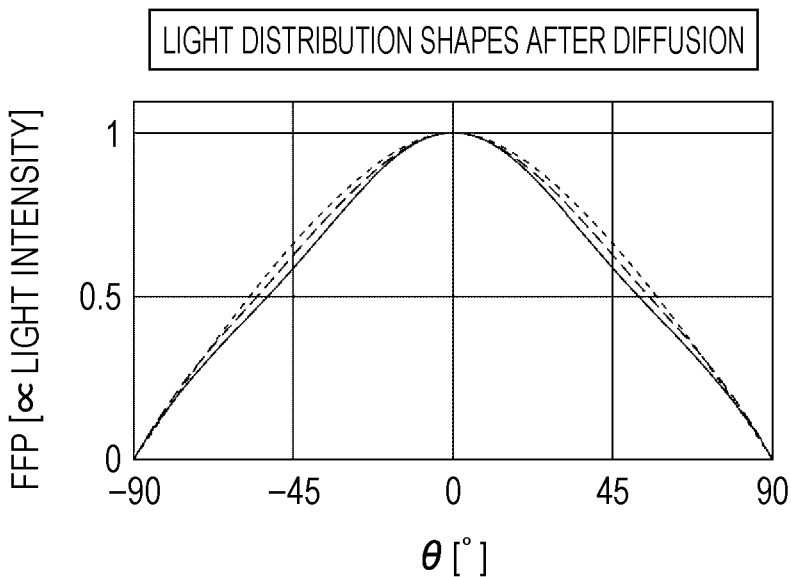
Figure 16:
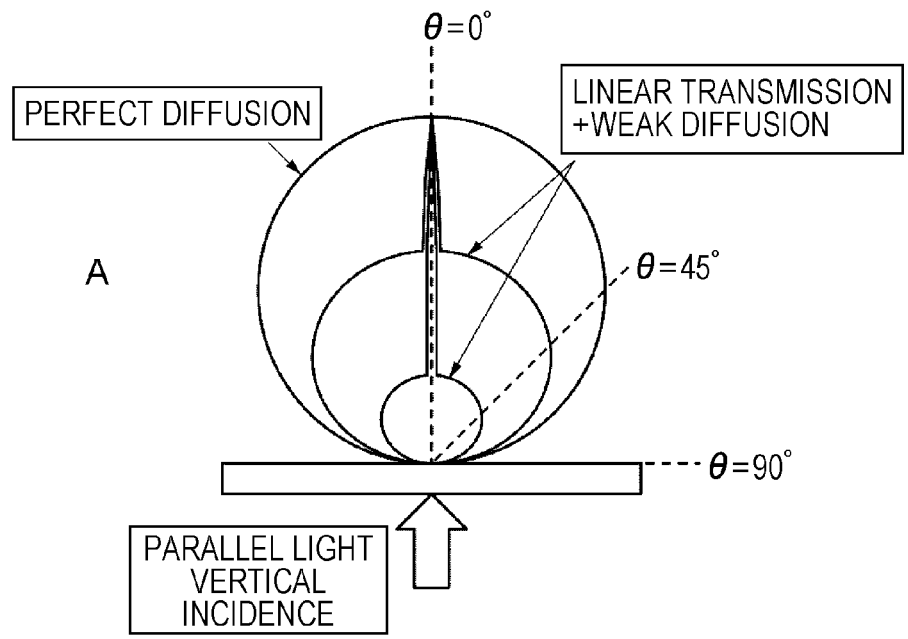
FIG. 16A is a diagram showing the transmission scattering properties at a time when parallel light vertically enters the diffusion layer.
FIG. 16B is a diagram showing the transmission scattering properties at a time when parallel light obliquely enters the diffusion layer.
Figure 16:
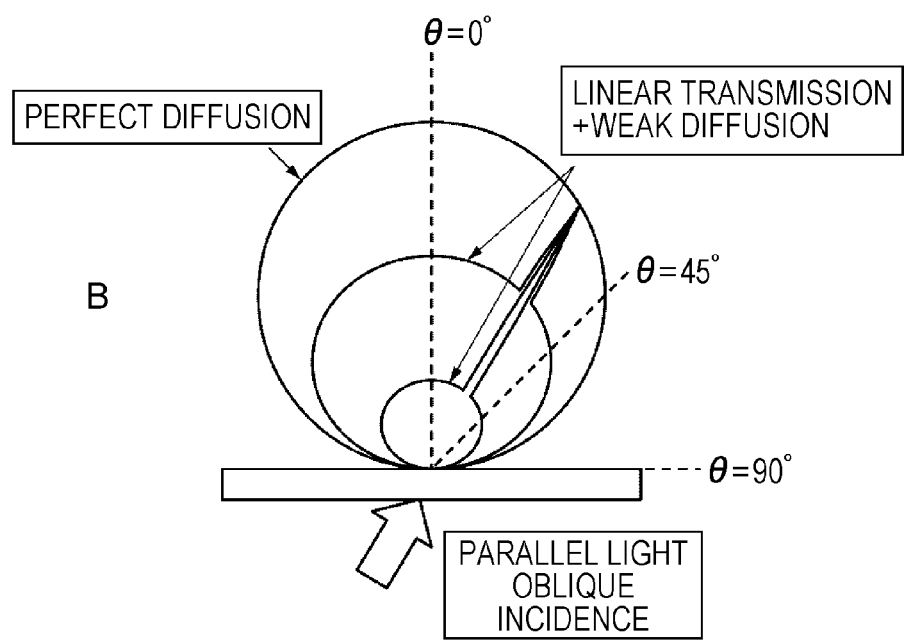
Figure 17:
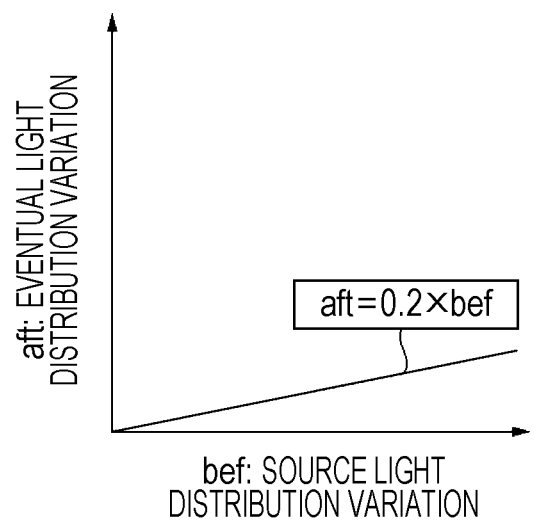
FIG. 17 is a diagram showing the light distribution variation relationship before and after transmission through a light diffusion layer having a certain density of fine particles.
Figure 18:
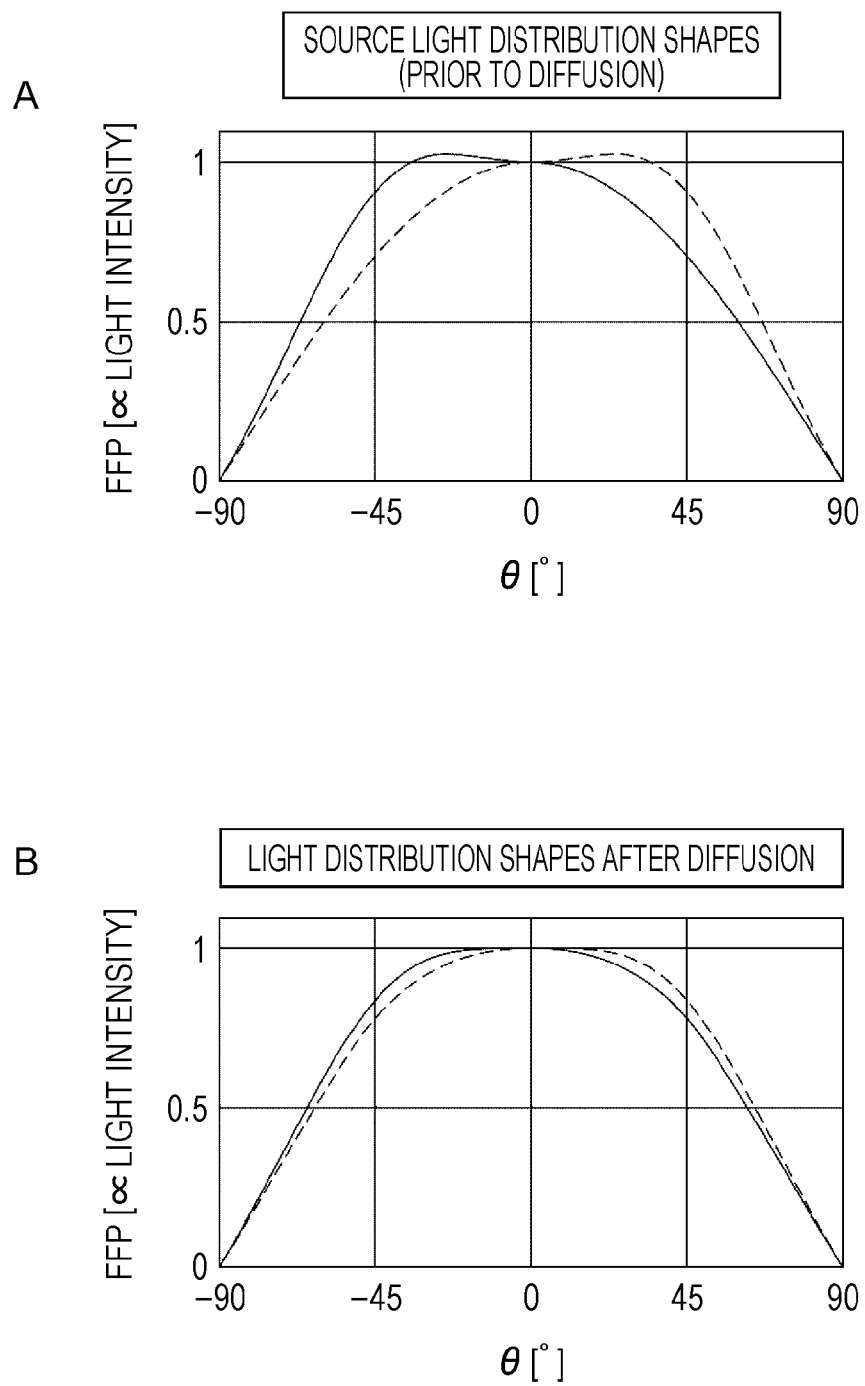
FIG. 18A is a diagram showing an FFP in a case where any diffusion layer is not provided.
FIG. 18B is a diagram showing an FFP in a case where a diffusion layer is provided.

The effects achieved by employing the light diffusion layer 63 can be confirmed by measuring the light distribution properties through pixel light emission before and after the light emitting element 61 is covered with the cover glass 53 having the light diffusion layer 63 (see FIGS. 15A and 15B). Meanwhile, the emitted light distribution at a time of parallel light incidence (transmission scattering properties Bidirectional Transmittance Distribution Function (BTDF), see FIGS. 16A and 16B) is obtained as the basic evaluation of the cover glass 53 having the light diffusion layer 63. In this manner, the light distribution properties after the covering with the cover glass 53 having the light diffusion layer 63 (see FIG. 15B) can be predicted and calculated with high precision, with the use of the pixel light distribution already obtained (the light distribution properties prior to the covering with the cover glass 53 having the light diffusion layer 63, see FIG. 15A). This BTDF varies with the density of the fine particles, and therefore, a back calculation method critical in setting the minimum necessary density is implemented. As a result, when the light distribution Far Field Patterns (FFPs) in FIGS. 15A and 15B are compared before and after diffusion at a certain angle θ, the light distribution variation relationship before and after the transmission in the light diffusion layer 63 having a predetermined fine particle density can be expressed as shown in FIG. 17. That is, the gradient is called the light distribution control sensitivity, and values below "1" prove that light distribution variation is restrained. The same applies to the light distribution FFPs shown in FIGS. 18A and 18B. In FIGS. 18A and 18B, two types of horizontally-reversed light distribution variation are shown as examples, on the assumption of horizontally-asymmetrical light distribution FFPs. As the cover glass 53 having the light diffusion layer 63 is employed, symmetric properties are improved, and variation can be reduced. Also, in a case where the light distribution is disturbed in a horizontal direction through the manufacturing process or the like, the variation can be corrected by additionally employing the light diffusion layer 63.

In the display device 50 according to the third embodiment, light distribution variation can be restrained, as the light diffusion layer 63 is provided on the light emitting element 61. Accordingly, the yield in a mass-production process can be improved. Also, the costs of the display device 50 can be lowered.

3.5 Modifications

Referring now to FIGS. 13B through 14C, example structures of the display device 50 according to modifications of the above described third embodiment are described.

As shown in FIG. 13B, in the display device 50, the light diffusion layer 63 may be provided along almost the entire principal surface facing toward the circuit board 51, of the two principal surfaces of the cover glass 53. With such a structure, the mass-producibility of the display device 50 can be increased.

As shown in FIG. 13C, the display device 50 may further include a light diffusion layer 65 filling the hollow space enclosed by the circuit board 51, the light reflection layer 62, and the cover glass 53. In such a structure, the entire exposed portion of the light emitting element 61 is enclosed directly by the light diffusion layer 65. In this case, the light diffusion layer 63 shown in FIG. 13A can be omitted.

As shown in FIG. 13D, the display device 50 may further include a sealing portion 66 made of a transparent resin material in the hollow space enclosed by the circuit board 51, the light reflection layer 62, and the cover glass 53.

As shown in FIG. 14A, the display device 50 may further include a light diffusion layer 67 that covers the entire exposed portion of the light emitting element 61. As shown in FIG. 14B, the display device 50 may further include a light diffusion layer 67 that covers part of the entire exposed portion of the light emitting element 61, such as the upper surface of the light emitting element 61.

As shown in FIG. 14C, the display device 50 may further include a black matrix 68 between the cover glass 53 and the light diffusion layer 63. The black matrix 68 has openings 68a, and, when seen from the z-axis direction, each opening 68a is provided on each corresponding light emitting element 61. The black matrix 68 is very thin, having a thickness of approximately 1 µm, for example. Accordingly, the black matrix 68 can be readily formed on the surface of the cover glass by a printing process, and does not bring a significant change to the structure of the display device 50.

4. Fourth Embodiment

An electronic apparatus according to a fourth embodiment of the present technology includes a display device 10 according to the first embodiment, a display device 70 according to the second embodiment, a display device 50 according to the third embodiment, or a display device 50 according to a modification of the third embodiment. Electronic apparatuses according to the fourth embodiment of the present technology will be described below.

Figure 10:
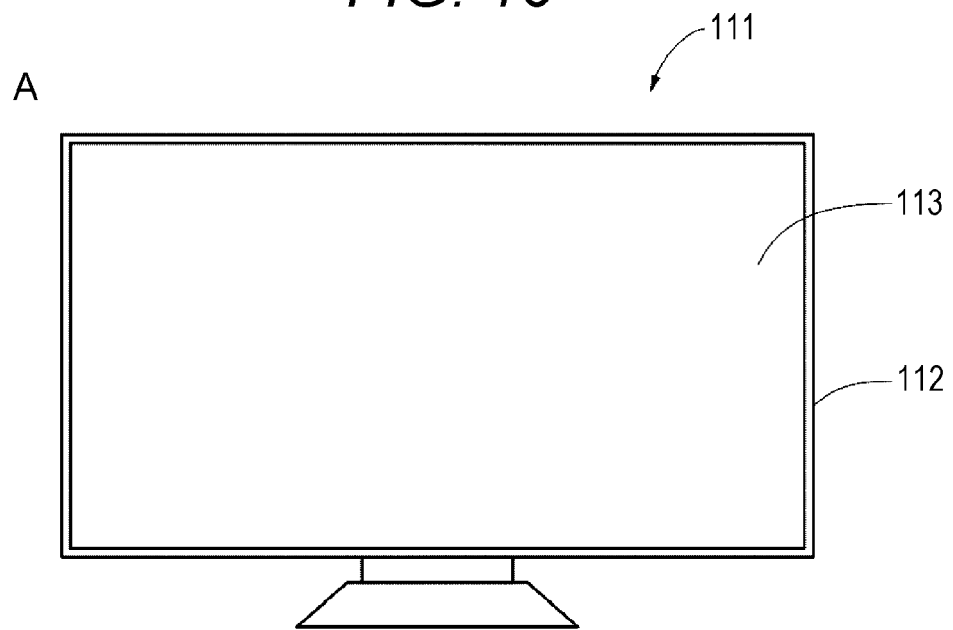
FIG. 10A is an external view of an example of a television apparatus as an electronic apparatus.
FIG. 10B is an external view of an example of a notebook-sized personal computer as an electronic apparatus.
Figure 10:
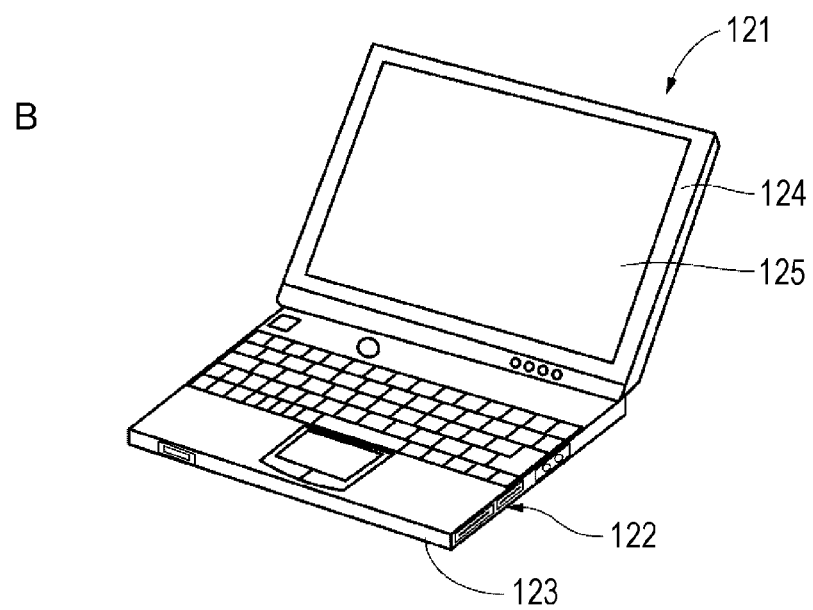

FIG. 10A is an external view of an example of a television apparatus as an electronic apparatus. The television apparatus 111 includes a housing 112, and a display device 113 housed in this housing 112. Here, the display device 113 is a display device 10 according to the first embodiment, a display device 70 according to the second embodiment, a display device 50 according to the third embodiment, or a display device 50 according to a modification of the third embodiment.

FIG. 10B is an external view of an example of a notebook-sized personal computer as an electronic apparatus. The notebook-sized personal computer 121 includes a computer main frame 122 and a display device 125. The computer main frame 122 and the display device 125 are housed in a housing 123 and a housing 124, respectively. Here, the display device 125 is a display device 10 according to the first embodiment, a display device 70 according to the second embodiment, a display device 50 according to the third embodiment, or a display device 50 according to a modification of the third embodiment.

EXAMPLES

In the description below, the present technology will be specifically described through reference examples, but the present technology is not limited to the reference examples.

The reference examples will be explained in the order shown below.

I. Reduction of specular reflection on a sealing portion surface

II. Reduction of specular reflection and diffuse reflection on a light absorbing layer surface <I. Reduction of Specular Reflection on a Sealing Portion Surface>

The reflectance reduction effect achieved through formation of a low-reflection layer on the curved surface (a partial spherical surface) of a sealing portion having the same refractive index as glass was examined in a simulative manner as described below.

Reference Example 1

First, a glass substrate having flat surfaces was prepared. After a low-reflection coating was formed on one principal surface (a flat surface) of the glass substrate by a spray coating method, natural drying was performed, and a low-reflection layer was formed. A fluororesin (trade name: DS-5305C, manufactured by HARVES, Co., Ltd.) was used as the material of the low-reflection coating. A light absorbing layer was then formed on the other principal surface of the glass substrate (the surface on the opposite side from the surface on which the low-reflection layer was formed). In the above described manner, an intended sample was obtained.

Reference Example 2

The same glass substrate as that of Reference Example 1 was prepared as a sample.

Reference Example 3

The reflection spectrum at the time when a low-reflection layer (having a refractive index n of 1.4 and a thickness of 95 nm) was formed on the surface of a glass substrate was calculated through simulation.

(Evaluation of Reflection Spectra)

Next, the reflectances at an incident angle of 5 degrees with respect to the surfaces of the samples obtained in the above described manner were measured with a spectrophotometer (trade name: U-4100, manufactured by Hitachi High-Technologies Corporation) (see FIG. 11A). The measurement results are shown in FIG. 11B.

Figure 11:
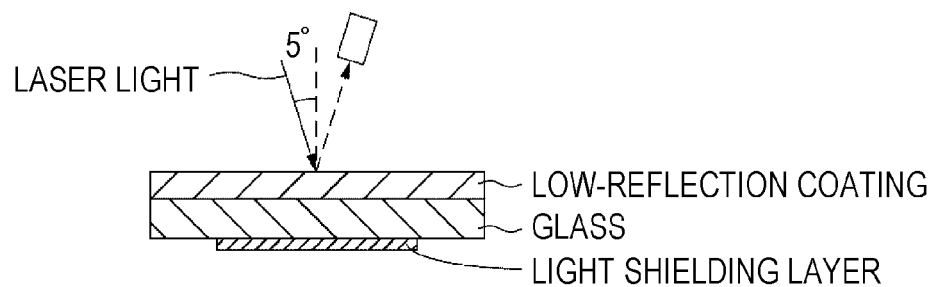
FIG. 11A is a diagram showing the conditions for measuring the reflection spectrum of a sample according to Reference Example 1.
FIG. 11B is a diagram showing the results of evaluation of the reflection spectrum of the sample according to Reference Example 1.
Figure 11:
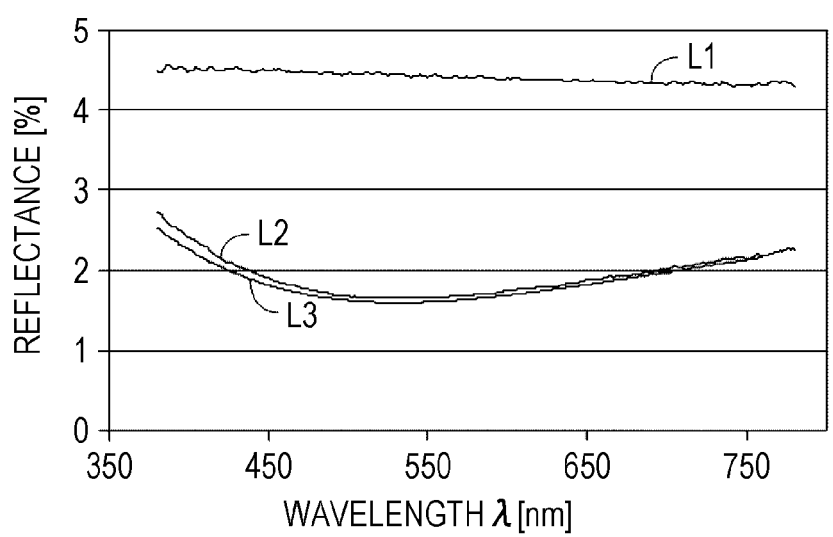

As can be seen from FIG. 11B, the actually measured value obtained from the actually manufactured sample (Reference Example 1) is substantially the same as the theoretical value obtained through simulation (Reference Example 3), and a reflectance reduction effect is achieved as expected.

In a case where a low-reflection layer is formed on the curved surface (a partial spherical surface, for example) of a sealing portion having the same refractive index as glass, the same effect as that in the case where a low-reflection layer is formed on a flat surface of a glass substrate can be expected.

<II. Reduction of Specular Reflection and Diffuse Reflection on a Light Absorbing Layer Surface>

The reflectance reduction effect achieved through formation of a low-reflection layer on the finely corrugated surface of a light absorbing layer was examined in a simulative manner as described below.

Reference Example 4

First, a glass substrate having flat surfaces was prepared. Surface black was then formed on one principal surface (a flat surface) of this glass substrate. After a low-reflection coating was formed on the surface of the surface black by a spray coating method, natural drying was performed, and a low-reflection layer was formed. A fluororesin (trade name: DS-5305C, manufactured by HARVES, Co., Ltd.) was used as the material of the low-reflection coating. A light absorbing layer was then formed on the other principal surface of the glass substrate (the surface on the opposite side from the surface on which the low-reflection layer was formed). In the above described manner, an intended sample was obtained.

(Evaluation of the Angle Dependence of Reflected Light Intensity)

Figure 12:
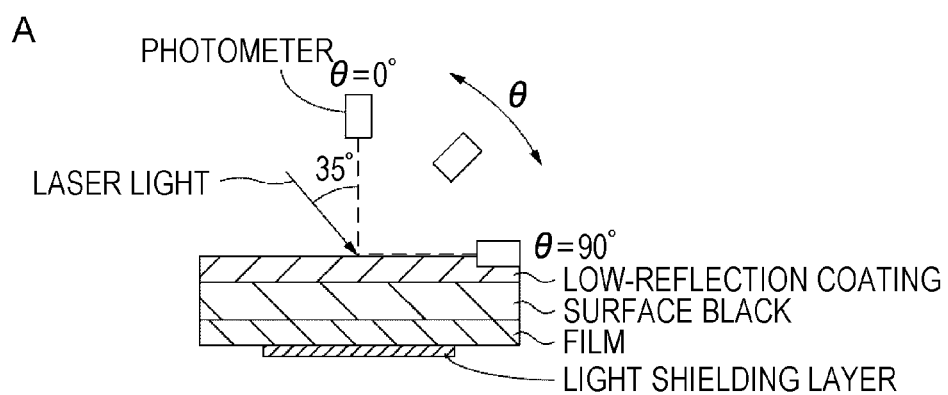
FIG. 12A is a diagram showing the conditions for measuring the angle dependence of the reflected light intensity of a sample according to Reference Example 4.
FIG. 12B is a diagram showing the results of evaluation of the angle dependence of the reflected light intensity of the sample according to Reference Example 4.
Figure 12:
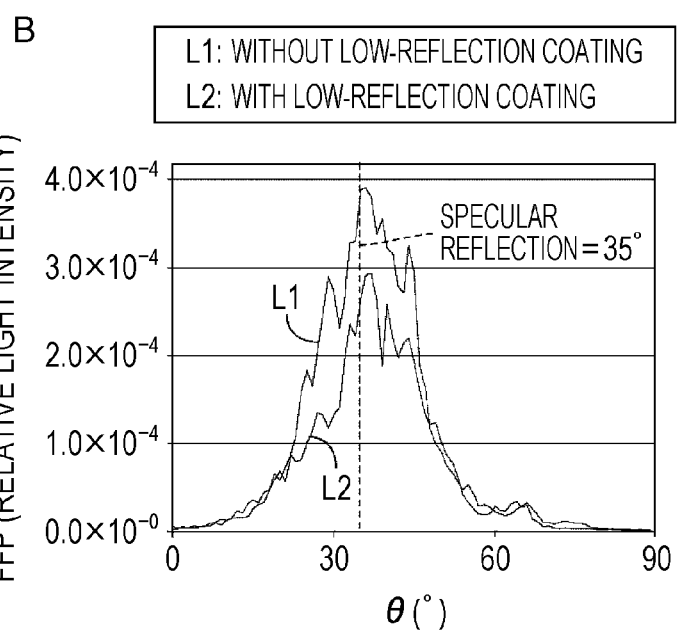

The angle dependence of the reflected light intensity on the low-reflection layer side of the sample obtained in the above described manner was measured with a photometer (GENESIA Gonio/Far Field Profiler) (see FIG. 12A).

The measurement results are shown in FIG. 12B. A laser (trade name: GLM-A2 ($\lambda$=532 nm), manufactured by Kochi Toyonaka Giken, Co., Ltd.) was used as the light source, and the incident angle with respect to the surface of the sample was set at 35 degrees.

As can be seen from FIG. 11B, specular reflection can be restrained while diffuse reflection is maintained.

Although embodiments of the present technology have been specifically described so far, the present technology is not limited to the above embodiments, and various changes based on the technical idea of the present technology can be made to them.

For example, the structures, methods, processes, shapes, materials, numerical values, and the like mentioned in the above embodiments are mere examples, and structures, methods, processes, shapes, materials, numerical values, and the like that are different from those mentioned above can be used as necessary.

Also, the structures, methods, processes, shapes, materials, numerical values, and the like mentioned in the above embodiments can be combined appropriately, without departing from the scope of the present technology.

In the example structures described in the above embodiments, light emitting elements are sealed with sealing portions, and a low-reflection layer is provided on the surfaces of the sealing portions. However, the present technology is not limited to those examples. The formation of the sealing portions may be skipped, and the low-reflection layer may be formed directly on the surfaces of the light emitting elements. That is, it is possible to employ a structure in which the light emitting units are not sealed with sealing portions but are formed with exposed light emitting elements, and the low-reflection layer is formed directly on the surfaces of the exposed light emitting elements.

Also, in the examples described in the above embodiments, the light emitting elements are LEDs. However, the light emitting elements are not necessarily LEDs, and organic electroluminescence elements or inorganic electroluminescence elements or the like may be used as the light emitting elements.

The present technology may also be embodied in the structures described below.

(1)
A display device including:
a plurality of light emitting units;
alight absorbing unit that surrounds each of the light emitting units; and
a low-reflection layer provided on the surfaces of the light emitting units and the surface of the light absorbing unit,
wherein
the surface of the light absorbing unit is a corrugated surface that diffuses light, and
the low-reflection layer is formed along the corrugated surface.

(2)
The display device of (1), wherein the light emitting units each include a light emitting element, and a sealing portion that seals the light emitting element.

(3)
The display device of (2), wherein the sealing portion has a flat surface, a corrugated surface, or a curved surface.

(4)
The display device of (2), wherein the sealing portion has a convexly- or concavely-curved surface, and
the low-reflection layer is formed along the curved surface.

(5)
The display device of (2), wherein the light emitting element is a light emitting diode or an electroluminescence element.

(6)
The display device of any one of (2) through (5), wherein the light absorbing unit has a plurality of openings, and the light emitting elements are provided in the openings.

(7)
The display device of any one of (2) through (6), wherein the sealing portion contains an almost transparent material having transparency or diffuse transmission properties.

(8)
The display device of (1), wherein the light emitting units each include an exposed light emitting element.

(9)
The display device of any one of (1) through (8), wherein the corrugated surface is formed with a plurality of fine particles.

(10)

The display device of any one of (1) through (9), wherein the light absorbing unit includes a light absorbing layer and a shaped layer, the shaped layer being provided on the surface of the light absorbing layer and having the corrugated surface.

(11)

The display device of any one of (1) through (10), wherein the low-reflection layer contains one or more materials selected from the group consisting of fluororesin, porous particles, and hollow particles.

(12)

The display device of any one of (1) through (11), wherein the low-reflection layer has a thickness equal to or greater than the wavelength of light designed to reduce reflection.

(13)

The display device of any one of (1) through (11), wherein the low-reflection layer has a thickness of approximately $\lambda/(4 \cdot n)$ ($\lambda$ being the wavelength of light designed to reduced reflection, n being the refractive index of the low-reflection layer).

(14)

The display device of any one of (1) through (13), wherein the light emitting units and the light absorbing unit have recesses.

(15)

A display device including a plurality of display cells that are two-dimensionally arranged, each of the display cells including:

a plurality of light emitting units;

a light absorbing unit that surrounds each of the light emitting units; and a low-reflection layer provided on the surfaces of the light emitting units and the surface of the light absorbing unit, wherein the surface of the light absorbing unit is a corrugated surface that diffuses light, and the low-reflection layer is formed along the corrugated surface.

(16)

An electronic apparatus including a display device including:

a plurality of light emitting units;

a light absorbing unit that surrounds each of the light emitting units; and a low-reflection layer provided on the surfaces of the light emitting units and the surface of the light absorbing unit, wherein the surface of the light absorbing unit is a corrugated surface that diffuses light, and the low-reflection layer is formed along the corrugated surface.

The present technology may also be embodied in the structures described below.

(1) A display device including a plurality of light emitting elements, wherein a light diffusion structure is provided near the light emitting elements.

(2) The display device of (1), wherein the light diffusion properties of the light diffusion structure lie in being optically transmissive.

(3) The display device of (1) or (2), wherein the light diffusion structure is provided directly on the surfaces of the light emitting elements.

(4) The display device of (1) or (2), further including a cover glass, wherein the light diffusion structure is provided on the surface of the cover glass.

(5) The display device of (4), wherein the cover glass is formed with opaque glass, etched glass, frosted glass, unwoven glass, or opal glass.

(6) The display device of (4) or (5), wherein light diffusion properties are controlled by adjusting the processed amount of the cover glass.

(7) The display device of (1), wherein the light diffusion structure is a light diffusion layer containing a binder and a plurality of fine particles.

(8) The display device of (7), wherein light diffusion properties are controlled by adjusting the amount of the fine particles contained in the light diffusion layer.

(9) The display device of (7) or (8), wherein the binder contains silicone resin, and the fine particles include fine particles containing melamine, silica, alumina, or titanium oxide.

(10) The display device of any one of (4) through (6), wherein, with a desired sensitivity, light distribution variation after diffusion can be restricted to values smaller than 1 in the relative ratio to the light distribution variation prior to the diffusion by adjusting the processed amount of the cover glass.

(11) The display device of any one of (7) through (9), wherein, with a desired sensitivity, light distribution variation after diffusion can be restricted to values smaller than 1 in the relative ratio to the light distribution variation prior to the diffusion by adjusting the amount of the fine particles contained in the light diffusion layer.

(12) A display device including a plurality of display cells that are two-dimensionally arranged, each of the display cells including a plurality of light emitting elements, wherein a light diffusion structure is provided near the light emitting elements.

(13)

An electronic apparatus including a display device including a plurality of light emitting elements, wherein a light diffusion structure is provided near the light emitting elements.

REFERENCE SIGNS LIST

1 Large-screen display device
10, 50 Display device
11, 51 Circuit board
12 Light absorbing unit
12a, 68a Opening
13, 52 Light emitting unit
13, 13a, 13b Low-reflection layer
21 Substrate
22 Wiring layer
23 Planarizing film
24 Drive IC
31, 61 Light emitting element
32, 66 Sealing portion
41 Light absorbing unit
42 Light absorbing layer
43, 63, 65, 67 Diffusion layer
53 Cover glass
62 Light reflection layer
64 Hollow portion
68 Black matrix

The invention claimed is:

1. A display device, comprising:
   at least one light emitting unit;
   a light absorbing unit that surrounds the at least one light emitting unit; and
   a low-reflection layer that is on a first surface of the at least one light emitting unit and a second surface of the light absorbing unit,
   wherein the second surface of the light absorbing unit has a first corrugated shape and the second surface is configured to diffuse light,
   wherein an upper surface and a lower surface of a portion of the low-reflection layer have a second corrugated shape, and
   wherein the portion corresponds to the first corrugated shaped second surface.

2. The display device according to claim 1,
   wherein the at least one light emitting unit includes a light emitting element, and a sealing portion that is configured to seal the light emitting element.

3. The display device according to claim 2, wherein the sealing portion has at least one of a flat surface, a corrugated surface, or a curved surface.

4. The display device according to claim 2,
   wherein the sealing portion has one of a convexly-curved surface and a concavely-curved surface, and
   the low-reflection layer is further on each of the convexly-curved surface and the concavely-curved surface.

5. The display device according to claim 2, wherein the light emitting element is at least one of a light emitting diode or an electroluminescence element.

6. The display device according to claim 2,
   wherein the light absorbing unit has at least one opening, and
   wherein the light emitting element is in the at least one opening.

7. The display device according to claim 2,
   wherein the sealing portion contains a transparent material with one of a transparency property or a diffuse transmission property.

8. The display device according to claim 1,
   wherein the at least one light emitting unit includes an exposed light emitting element.

9. The display device according to claim 1, wherein the first corrugated shaped second surface includes a plurality of fine particles.

10. The display device according to claim 1,
    wherein the light absorbing unit includes a light absorbing layer and a shaped layer, and
    wherein the shaped layer is in between a third surface of the light absorbing layer and the portion,
    wherein the shaped layer has the first corrugated shape.

11. The display device according to claim 1, wherein the low-reflection layer contains at least one of fluororesin, porous particles, or hollow particles.

12. The display device according to claim 1, wherein the low-reflection layer has a thickness equal to or greater than a wavelength of the light.

13. The display device according to claim 1,
    wherein the low-reflection layer has a thickness of $\lambda/(4n)$,
    wherein $\lambda$ is a wavelength of the light, and
    wherein n is a refractive index of the low-reflection layer.

14. The display device according to claim 1, wherein both of the at least one light emitting unit and the light absorbing unit have recesses.

15. A display device, comprising
    a plurality of display cells that are arranged two-dimensionally,
    wherein each of the plurality of display cells including:
    at least one light emitting unit;
    a light absorbing unit that surrounds the at least one light emitting unit; and
    a low-reflection layer that is on a first surface of the at least one light emitting unit and a second surface of the light absorbing unit,
    wherein the second surface of the light absorbing unit has a first corrugated shape and the second surface is configured to diffuse light,
    wherein an upper surface and a lower surface of a portion of the low-reflection layer have a second corrugated shape, and
    wherein the portion corresponds to the first corrugated shaped second surface.

16. An electronic apparatus, comprising
    a display device including:
    at least one light emitting unit;
    a light absorbing unit that surrounds the at least one light emitting unit; and
    a low-reflection layer that is on a first surface of the at least one light emitting unit and a second surface of the light absorbing unit,
    wherein the second surface of the light absorbing unit has a first corrugated shape and the second surface is configured to diffuse light,
    wherein an upper surface and a lower surface of a portion of the low-reflection layer have a second corrugated shape, and
    wherein the portion corresponds to the first corrugated shaped second surface.

* * * * *